(12) United States Patent
Hosomi

(10) Patent No.: US 6,740,981 B2
(45) Date of Patent: May 25, 2004

(54) SEMICONDUCTOR DEVICE INCLUDING MEMORY UNIT AND SEMICONDUCTOR MODULE INCLUDING MEMORY UNITS

(75) Inventor: Eiichi Hosomi, Kanagawa-ken (JP)

(73) Assignee: Kabushiki Kaisha, Toshiba, Kanagawa-ken (JP)

( * ) Notice: Subject to any disclaimer, the term of this patent is extended or adjusted under 35 U.S.C. 154(b) by 0 days.

(21) Appl. No.: 09/816,170

(22) Filed: Mar. 26, 2001

(65) Prior Publication Data
US 2001/0028114 A1 Oct. 11, 2001

(30) Foreign Application Priority Data
Mar. 27, 2000 (JP) ...................... P2000-087644

(51) Int. Cl.$^7$ .............................................. H01L 23/48
(52) U.S. Cl. ...................... 257/778; 257/777; 257/779; 257/780; 257/784; 257/786; 257/723; 257/686
(58) Field of Search ................................ 257/778, 723, 257/686, 777, 780, 785, 786, 67, 68, 71, 296, 300, 303, 906, 915, 918, 298, 299, 779

(56) References Cited
U.S. PATENT DOCUMENTS

| | | | |
|---|---|---|---|
| 4,679,167 A | | 7/1987 | Finnell |
| 4,996,583 A | | 2/1991 | Hatada |
| 5,179,536 A | * | 1/1993 | Kasa et al. .................. 365/200 |
| 5,708,298 A | * | 1/1998 | Masayuki et al. ........... 257/723 |
| 5,761,609 A | * | 6/1998 | Chen .......................... 455/26.1 |
| 5,793,998 A | * | 8/1998 | Copeland et al. ............ 395/309 |
| 5,796,653 A | * | 8/1998 | Gaultier .................. 365/185.09 |
| 5,809,263 A | * | 9/1998 | Farmwald et al. .......... 395/309 |
| 6,262,488 B1 | * | 7/2001 | Masayuki et al. ........... 257/777 |
| RE37,539 E | * | 2/2002 | Oguchi et al. ............... 257/686 |
| 6,351,406 B1 | * | 2/2002 | Johnson et al. ............. 365/103 |
| 6,515,373 B2 | * | 2/2003 | Barth ......................... 710/301 |

FOREIGN PATENT DOCUMENTS

| | | |
|---|---|---|
| JP | 2-290048 | 11/1990 |
| JP | 6-342874 | 12/1994 |
| JP | 10-97463 | 4/1998 |

* cited by examiner

Primary Examiner—Nathan J. Flynn
Assistant Examiner—Fazli Erdem
(74) Attorney, Agent, or Firm—Finnegan, Henderson, Farabow, Garrett & Dunner, L.L.P.

(57) ABSTRACT

A semiconductor device comprises a memory unit, a selecting signal terminal, and an identifying unit. The selecting signal terminal receives a memory unit selecting signal which is commonly transmitted to a plurality of memory units. The identifying unit distinguishes the memory unit from other memory units on the basis of the memory unit selecting signal, and includes an identifier generating circuit and a memory unit selecting circuit. A plurality of semiconductor devices are laid one over after another, thereby constituting a semiconductor module.

20 Claims, 17 Drawing Sheets

|  |  | IDin2 | |
|---|---|---|---|
|  |  | 0 | 1 |
| IDin1 | 0 | 0,0 | 1,0 |
|  | 1 | 1,1 | 0,0 |

RELATED ART

SEMICONDUCTOR DEVICE INCLUDING MEMORY UNIT AND SEMICONDUCTOR MODULE INCLUDING MEMORY UNITS

CROSS-REFERENCE TO RELATED APPLICATION

This application claims benefit of priority under 35 U.S.C. §119 to Japanese Patent Application No. 2000-87644, filed on Mar. 27, 2000, the entire contents of which is incorporated by reference herein.

BACKGROUND OF THE INVENTION

1. Field of the Invention

The present invention relates to a semiconductor device including at least one of memory unit and a semiconductor module including at least memory units, and more particularly relates to a semiconductor device has at least one of memory unit which can lay over one after another and a semiconductor module has at least a plurality of memory units which can lay over one after another. Further, the invention relates to a semiconductor device has at least one of memory unit which can lay over to at least one of another memory unit of the same structure and a semiconductor module has at least a plurality of memory units which can lay over to each other and formed the same structure.

2. Description of the Related Art

Semiconductor devices are strongly required to be compact as lap top personal computers (PC), portable terminal equipment (PDA), portable phones or the like have become popular. Especially, semiconductor memories for storing a large amount of information such as a dynamic random access memory (called "DRAM" hereinafter) are being required to have an increased storage capacity.

In the foregoing DRAM, a storage capacity realized by a single semiconductor chip depends upon minute machining precision in a semiconductor manufacturing process. In order to assure a sufficient storage capacity, portable equipment should be provided with a plurality of DRAMs (i.e. a plurality of semiconductor chips). Usually, the plurality of DRAMs are two-dimensionally mounted on the same plane of a printed circuit board such as a mother board, daughter board or the like of the portable equipment.

However, with the foregoing mounting structure, the DRAMs occupy a large space on the printed circuit board, so that it has been very difficult to downsize the portable equipment. In order to overcome such a problem, it has been proposed to three-dimensionally mount DRAMs on a printed circuit board.

Referring to FIG. 16 of the accompanying drawings, a synchronous DRAM system (called "SDRAM" system hereinafter) 100 comprises: four memory banks 101 to 104; a clock buffer circuit 110; a command decoding circuit 111; a control signal generating circuit 112; an address buffer circuit 113; a mode register circuit 114; a refresh counter circuit 115; a column counter circuit 116; a data controlling circuit 117; and a data output buffer circuit 118. Each of the memory banks 101 to 104 houses a memory cell array 130, a column decoding circuit 131, a row decoding circuit 132, and a sense amplifier 133 thereon.

A storage capacity of each of the memory banks 101 to 104 is 16-Mbits, so that the SDRAM system 100 has a total storage capacity of 64-Mbits. The memory cell array 130 receives 12-bit row address signals and 8-bit column address signals. There are provided 16 data lines. These values depend upon the storage capacity of the SDRAM system 100. For instance, an SDRAM system having a storage capacity of 256-Mbits uses 13-bit row address signals and 9-bit column address signals.

The clock buffer circuit 110 receives clock signals CLK and CKE. The command decoding circuit 111 receives not only the clock signal CKE but also a chip selecting signal CS, a row address strobe signal RAS, a column address strobe signal CAS, a write enable signal WE, and an address signal $A_{10}$. The address buffer circuit 113 receives address signals $A_{10}$, $A_0$–$A_9$ and $A_{11}$, and bank selecting signals BS0 and BS1. Further, the data output buffer circuit 118 sends and receives data signals DQ0 to DQn.

The SDRAM system 100 writes and reads data according to the operation flowchart shown in FIG. 17.

(1) Bank Active Operation

First of all, the address signals $A_0$ to $A_{11}$ are inputted to the address buffer circuit 113. The 12-bit row address signals are determined on the basis of the address signals $A_0$ to $A_{11}$ (in step 120). The row address strobe signal RAS, column address strobe signal CAS, and write enable signal WE are inputted to the command decoding circuit 111. When the row address strobe signal has a low level "L", the column address strobe signal CAS has the high level "H", and the write enable signal WE has a high level "H" (in step 121), the chip selecting signal CS is then inputted to the command decoding circuit 111. If the chip selecting signal CS has the low level "L" (in step 122), the SDRAM system 100 will be selected. In this state, the bank selecting signals BS0 and BS1 are inputted to the address buffer circuit 113 (in step 123). One of the memory banks 101 to 104 is activated in response to the bank selecting signals BS0 and BS1. For instance, it is assumed that the memory bank 101 is activated. Even if the chip selecting signal CS has the high level "H" in this state, no data is written and read since the SDRAM system 100 has not been activated. The row address signal CAS is input to the activated memory bank 101.

(2) Data Write Operation and Data Read Operation

The activated memory bank 101 receives the 9-bit column address signals CAS in response to the address signals $A_0$ to $A_8$ inputted to the address buffer circuit 113 (in step 124). The command decoding circuit 111 receives the row address strobe signal RAS, column address strobe signal CAS and write enable signal WE. In this state, if the row address signal RAS has the high level "H", the column address strobe signal CAS has the low level "L", and the write enable signal WE has the high level "H" (in steps 125 and 126), in the memory cell array 130 of the activated memory bank 101, a data stored at a memory cell of an address, which is selected on the basis of the row address signal RAS and the column address signal CAS, is read from the memory cell (in step 127). The data is outputted as the data signal DQ from the data output buffer circuit 118. On the other hand, if the write enable signal WE has the low level "L", in the memory cell array 130 of the activated memory bank 101, the data is written into the memory cell of the address, which is selected on the basis of the row address signal RAS and the column address signal CAS (in step 128). The data written into the memory cell is inputted to the data output buffer circuit 118 as the data signal DQ.

The SDRAM system 100 to and from which the data is written and read is activated in response to the chip selecting signals CS.

When the SDRAM system 100 shown in FIG. 16 is packaged as one semiconductor memory and a plurality of SDRAM systems 100 are simply stacked on a printed circuit board, a terminal for supplying the chip selecting signal (i.e. a chip selecting lead pin) is commonly used for all of the SDRAM systems 100. An external device can neither activate a particular SDRAM system 100 nor write the data into it or read the data therefrom.

Japanese Patent Laid-open Publications No. Hei 2-290048 and No. Hei 6-342874 disclose the inventions which can overcome the foregoing technical problems.

In Japanese Patent Laid-open Publication No. Hei 2-290048 (called "Reference 1"), packages 131 to 134 of the tape-automated bonding type (called "TAB") are stacked on the printed circuit board 130 as shown in FIG. 18. The packages 131 to 134 are respectively provided with outer leads 135A to 135D for sending common signals such as an address signal, a power source and so on, and outer leads 136A to 136D for sending the chip selecting signal CS to the packages 131 to 134. The outer leads 136A to 136D are branched into a plurality of sections, which are dislocated one by one and are electrically connected to terminals 130A to 130D of the printed circuit board 130 via the outer leads 137A to 137D. In other words, the chip selecting signal CS can be independently supplied to the packages 131 to 134 via the outer leads 137A to 137D.

In the Japanese Patent Laid-open Publication No. Hei 6-342874 (called "Reference 2), the package substrates 141 to 144 are stacked on the printed circuit board 140 as shown in FIG. 19. The package substrates 141 to 144 are respectively provided with the front electrodes 145A to 145H and the rear electrodes 146A to 146H, which are electrically connected via the through-holes. Further, the front electrodes 145A to 145H and rear electrodes 146A to 146H are arranged in a staggered manner, so that the package substrates 141 to 144 can independently receive the chip selecting signal.

However, the foregoing inventions of the References 1 and the References 2 seem to suffer from the following problems.

(1) In the Reference 1, the outer leads 137A to 137D are respectively connected to one end each of the branched outer leads 136A to 136D, so that the chip selecting signal CS can be independently supplied to the packages 131 to 134. Therefore, it is possible to increase the storage capacity by stacking a plurality of the packages 131 to 134 having the same structure. When the four packages 131 to 134 are stacked, the four outer leads 137A to 137D should be provided. Each of the outer leads 136A to 136D is branched into four sections. Further, if eight packages are stacked, eight outer leads are required. Each of the outer leads should be branched into eight sections. In other words, the packages 131 to 134 are enlarged depending upon the number of branched sections of each of the outer leads 136A to 136D.

(2) With the Reference 2, the front electrodes 145A to 145H and rear electrodes 146A to 146H are arranged in the staggered manner in order to supply the chip selecting signals CS. Thus, the chip selecting signals CS are separately supplied to the package substrates 141 to 144. It is possible to increase the storage capacity by stacking the package substrates 141 to 144 having the same structure. As with the Reference 1, the number of rows of the front electrodes 145A to 145H and rear electrodes 146A to 146H increases in accordance with the increase of the chip selecting signals, which would inevitably enlarge the package substrates 141 to 144.

(3) In the References 1 and 2, the more the packages 131 to 134 or the package substrates 141 to 144, the more chip selecting signals CS, and the more terminals for supplying the chip selecting signals CS. The packages 131 to 134 or the package substrates 141 to 144 have to be enlarged depending upon the increase in the number of the foregoing terminals. Therefore, it has been very difficult to increase the storage capacity of three-dimensionally stacked devices.

SUMMARY OF THE INVENTION

According to the present invention, a semiconductor device comprises: a memory unit; a selecting signal terminal for receiving a memory unit selecting signal which is common to a plurality of memory units; and an identifying unit which includes at least a memory unit selecting circuit for selecting the memory unit on the basis of an identifier assigned to the memory unit and the memory unit selecting signal, and an identifier generating circuit for generating identifiers for other memory units on the basis of the identifier.

According to embodiment of the present invention, the identifier generating circuit of the semiconductor device is mainly constituted by an adder circuit or a subtracter circuit.

According to embodiment of the present invention, in the semiconductor device, the identifier is one bit data or a plurality of bit data, and the identifier generating circuit is an adder circuit for carrying the identifier data of the memory unit bit by bit.

According to embodiment of the present invention, the identifier generating circuit of the semiconductor device is the adder circuit for carrying the identifier of the memory unit by a half bit.

According to embodiment of the present invention, the identifier generating circuit of the semiconductor device is electrically connected to a standard voltage power supply for a circuit system or a circuit operation power supply, and the standard voltage power supply voltage or the circuit operation power supply is used as the identifier.

According to embodiment of the present invention, the memory unit selecting circuit of the semiconductor device is a comparator for compares the identifier with the memory unit selecting signal.

According to embodiment of the present invention, the memory unit of the semiconductor device is either a DRAM (including SDRAM or the like) or a static random access memory (SRAM) or a non-volatile memory which is a read-only memory (ROM), an erasable programmable read-only memory (EPROM) or an electrically erasable programmable read-only memory (EEPROM).

According to embodiment of the present invention, in the semiconductor device, the selecting signal terminal which receives the memory unit selecting signal is a surplus signal terminal out of address signal terminals which are used for selecting address of the memory unit.

According to the present invention, a semiconductor device comprising: a memory unit; a selecting signal terminal for receiving a memory unit selecting signal which is common to a plurality of memory units; and an identifying unit which is provided outside the memory unit and includes at least a memory unit selecting circuit for selecting the memory unit on the basis of an identifier assigned thereto and a memory unit selecting signal, and an identifier generating circuit for generating identifiers for other memory units on the basis of the identifier of the memory unit.

According to embodiment of the present invention, in the semiconductor device, the memory unit and the identifying unit are constituted by separate semiconductor chips.

According to embodiment of the present invention, in the semiconductor device, the semiconductor chips constituting the memory unit and the identifying unit are constituted by separate packages.

According to embodiment of the present invention, in the semiconductor device, the semiconductor chips constituting the memory unit and the identifying unit are constituted by the same package.

According to embodiment of the present invention, the selecting signal terminal of the semiconductor device is provided in the semiconductor chip constituting the identifying unit.

According to the present invention, a semiconductor module comprising: a first memory unit; a second memory unit positioned on or by the first memory unit; a first selecting signal terminal provided in the first memory unit and for receiving a memory unit selecting signal which is common to a plurality of memory units; a second selecting signal terminal provided in the second memory unit and for receiving the memory unit selecting signal which is common to a plurality of memory units; a first identifying unit including at least: a first memory unit selecting circuit for selecting the first memory unit on the basis of a first identifier assigned thereto and the memory unit selection signal; and a first identifier generating circuit for generating a second identifier for the second memory unit on the basis of the first identifier; and a second identifying unit including at least: a second memory unit selecting circuit for selecting the second memory unit on the basis of the second identifier assigned thereto and the memory unit selection signal; and a second identifier generating circuit for generating a third identifier for a third memory unit on the basis of the second identifier.

According to embodiment of the present invention, the first identifier generating circuit and the second identifier generating circuit of the semiconductor module are mainly constituted by an adder circuit or a subtracter circuit.

According to embodiment of the present invention, the first identifier generating circuit of the semiconductor module is electrically connected to a standard voltage power supply for a circuit system or a circuit operation power supply, and the standard voltage power supply or the circuit operation power supply is used as the first identifier.

According to embodiment of the present invention, in the semiconductor module, the first memory unit selecting circuit is a comparator for compares the first identifier and the memory unit selecting signal, and the second memory unit selecting circuit is a comparator for compares the second identifier and the memory unit selecting signal.

According to embodiment of the present invention, in the semiconductor module, the second memory unit is stacked on the first memory unit.

According to embodiment of the present invention, in the semiconductor module, the second memory unit is juxtaposed to the first memory unit.

According to embodiment of the present invention, semiconductor module further comprising at least one memory unit and at least one identifying unit.

According to the present invention, a semiconductor device comprising: a memory unit; a selecting signal terminal for receiving a memory unit selecting signal which is common to a plurality of memory units; and an identifying unit at least including an identifier generating circuit provided with at least a fuse element for generating an identifier assigned to the memory unit, and a memory unit selecting circuit for selecting the memory unit on the basis of an identifier assigned thereto and the memory unit selecting signal.

According to embodiment of the present invention, in the semiconductor device, the identifier generating circuit further includes a resistance element; the fuse element has one end thereof electrically connected to a standard voltage power supply for a circuit system and the other end thereof electrically connected to the memory unit selecting circuit and one end of the resistance element; and the resistance element has the other end thereof electrically connected to the circuit operation power supply for the circuit system.

According to embodiment of the present invention, the resistor element of the semiconductor device has a resistance value which is higher than a resistance value of the fuse element.

According to the present invention, a semiconductor device comprising: a memory unit; a selecting signal terminal for receiving a memory unit selecting signal which is common to a plurality of memory units; and an identifying unit at least including an identifier generating circuit provided with at least a wire for generating an identifier for the memory unit, and a memory unit selecting circuit for selecting the memory unit on the basis of the identifier assigned thereto and the memory unit selecting signal.

Further, according to embodiment of the present invention, the wire of the semiconductor device has one end thereof electrically connected to a standard voltage power supply for a circuit system or a circuit operation power supply for a circuit system and the other end thereof electrically connected to the memory unit selecting circuit.

DETAILED DESCRIPTION OF THE PREFERRED EMBODIMENTS

Figure 1:
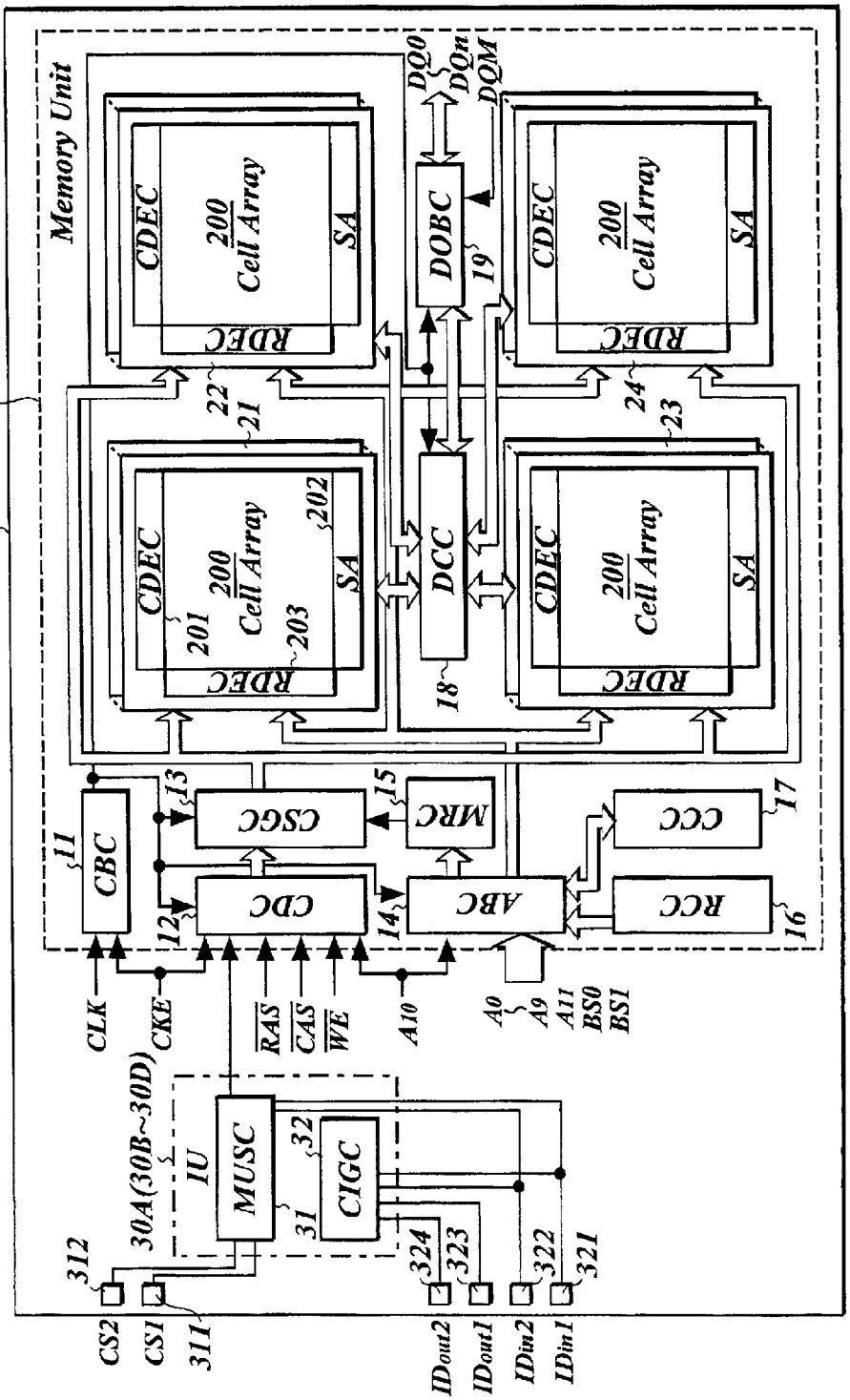
FIG. 1 is a system block diagram of a semiconductor device according to a first embodiment of the invention.

The invention will be described with reference to the preferred embodiments shown in the drawings. The invention is assumed to be applied to a semiconductor device and a semiconductor module comprising at least a DRAM used as memory unit.

First Embodiment

[Structure of Semiconductor Device]

In a first embodiment of the invention, a semiconductor device 1 is constituted by an SDRAM system. Referring to FIG. 1, the semiconductor device 1 comprises at least: a memory unit 10A; selecting signal terminals 311 and 312 for receiving memory unit selecting signals CS1 and CS2 which are common to not only the memory unit 10A but also other memory units (10B to 10D) to be described later; and an identifying unit 30A for distinguishing (or selecting) the memory unit 10A from the memory units 10B to 10D in response to the memory unit selecting signals CS1 and CS2.

The first embodiment is realized by a semiconductor module in which a total of four semiconductor devices 1 to 4 having the memory units 10A, 10B, 10C and 10D are stacked, or less than four semiconductor devices (e.g. two semiconductor devices) are stacked. The semiconductor devices 2 to 4 will be described later.

In the semiconductor device 1, the memory unit 10A includes four memory banks 21 to 24, a clock buffer circuit 11, a command decoding circuit 12, a control signal generating circuit 13, an address buffer circuit 14, a mode register circuit 15, a refresh counter circuit 16, a column counter circuit 17, a data control circuit 18, and a data output buffer circuit 19. The term "memory unit" refers to a unit for storing information, and covers memories dedicated to writing and reading information. Each of the memory banks 21 to 24 is provided with a memory cell array 200, a column decoding circuit (CDEC) 201, a row decoding circuit (RDEC) 203, and a sense amplifier (SA) 202.

Each of the memory banks 21 to 24 has a storage capacity of 16-Mbits, for example, which is variable. The memory unit 10A has a storage capacity of 64-Mbits in total. The memory cell array 200 receives 12-bit row address signals and 8-bit column address signals. There are sixteen data lines. The foregoing values vary with the storage capacity of the memory unit 10A. For example, if the memory unit 10A has the storage capacity of 256-Mbits, 13-bit row address signals and 9-bit column address signals will be utilized. Also, the semiconductor device 1 may be equipped with one, two, eight or any more memory bank.

The clock buffer circuit 11 receives the clock signals CLK and CKE, and the command decoding circuit 12 receives the clock signal CKE, a row address strobe signal RAS, a column address strobe signal CAS, a write enable signal WE and an address signal $A_{10}$. Further, the command decoding circuit 12 receives via the identifying unit 30A the selection signal for selecting the memory unit 10A. The address buffer circuit 14 receives the address signals $A_{10}$, $A_0$ to $A_9$, and $A_{11}$, and bank select signals BS0 and BS1. The data output buffer circuit 19 receives and transmits data signals DQ0 to DQn.

The identifying unit 30A (30B to 30D) identifies the memory unit 10A (10B to 10D) on the basis of the memory unit selecting signals CS1 and CS2 supplied to the selecting signal terminals 311 and 312. Accordingly, the identifying unit 30A includes at least: a memory unit selecting circuit 31 for selecting the memory unit 10A on the basis of the identifier of the memory unit 10A and the memory unit selecting signals CS1 and CS2; and an identifier generating circuit 32 for generating identifiers for the other memory unit (10B).

The memory unit selecting signals CS1 and CS2 are simultaneously transmitted to all of the memory units 10A to 10D, but not separately. Therefore, the semiconductor device 1 is provided with two selecting signal terminals 311 and 312 to which the memory unit selecting signals CS1 and CS2 are supplied, respectively. The same holds true to each of the semiconductor devices 2 to 4 stacked on the semiconductor device 1.

Each of the memory unit selecting signals CS1 and CS2 are one-bit signals having the low level and the high level (e.g. they correspond to "0" and "1"). In other words, the memory unit selecting signals CS1 and CS2 have a total of two-bit data such as "0,0", "0,1", "1,0" and "1,1", which are simultaneously supplied to the memory units 10A to 10D.

In the first embodiment, the four semiconductor devices 1 to 4 (i.e. the memory units 10A to 10D) are assumed to be stacked one over after another, so that only two selecting signal terminals 311 and 312 are provided. If eight semiconductor devices (i.e. eight memory units) are stacked at maximum, three selecting signal terminals will be provided in order to supply 3-bit memory unit selecting signals CS1 to CS3. If sixteen semiconductor devices (i.e. 16 memory units) are stacked at maximum, four selecting signal terminals will be provided in order to supply 4-bit memory unit selecting signals CS1 to CS4. If 16 or more semiconductor devices (i.e. 16 memory units) are provided, five or more selecting signal terminals will be provided in order to supply 5-bit or more—bit memory unit selecting signals CS1 to CSn.

The memory unit selecting circuit 31 for the identifying unit 30A is connected to the selecting signal terminals 311 and 312 in order to receive the memory unit selecting signals CS1 and CS2. Further, the memory unit selecting circuit 31 is connected to identifier input terminals 321 and 322 in order to receive identifier generating signals $ID_{in}1$ and $ID_{in}2$, thereby producing the identifier for the memory unit 10A.

The identifier generating circuit 32 is connected to the identifier input terminals 321 and 322 for receiving the identifier generating signals for the memory unit 10A, and to identifier output terminals 323 and 324 for producing and outputting identifiers for the other memory units (10B to 10D).

The memory unit selecting signals CS1 and CS2 are the 2-bit signals, so that the identifier is made of 2-bit data. In other words, the identifier input terminal 321 receives the identifier generating signal $ID_{in}1$ while the identifier input terminal 322 receives the identifier generating signal $ID_{in}2$. The identifier output terminals 323 and 324 transmit identifier generating signals $ID_{out}1$ and $ID_{out}2$, respectively.

Each of the identifiers is provided for each of the memory units (10A to 10D), and is used as a specific identification code for selecting a specific memory unit (e.g. the memory unit 10A). For instance, it is assumed that a signal "0,0" is assigned as the identifier for the memory unit 10A. If the memory unit selecting signals CS1 and CS2 represent "0", respectively, the memory unit 10A will be activated.

Figure 2:
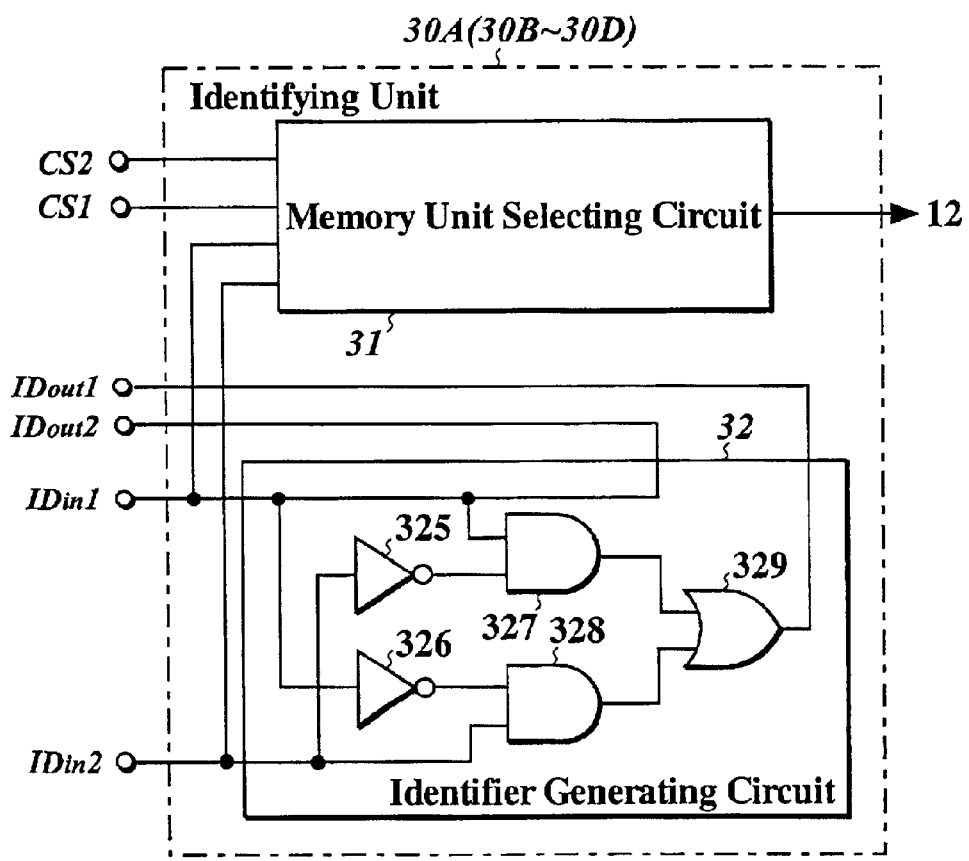
FIG. 2(A) is a block diagram of an identifying unit and an identifier generating circuit of the semiconductor device of FIG. 1.
FIG. 2(B) is a table showing truth values of the identifier generating circuit of the identifying unit of FIG. 2(A).

Referring to FIG. 2(A), the identifier generating circuit 32 is constituted by an adder circuit including inverter circuits 325 and 326, AND circuits 327 and 328, and an OR circuit 329. As shown in the truth value table in FIG. 2(B), the identifier generating circuit 32 receives the signals "0" as the identifier generating signals $ID_{in}1$ and $ID_{in}2$, respectively. The signals "0,0" are the identifier peculiar to the memory unit 10A. When the signal "0" is outputted as the identifier generating signal $ID_{out}1$, an added signal "1" is outputted as the identifier generating signal $ID_{out}2$. The signal "0,1" as the identifier generating signals $ID_{out}1$ and $ID_{out}2$ is used as an identifier for the memory unit 10B of the semiconductor device 2 on the semiconductor device 1. Alternatively, the identifier generating circuit 32 may be a subtractor circuit 32.

Figure 3:
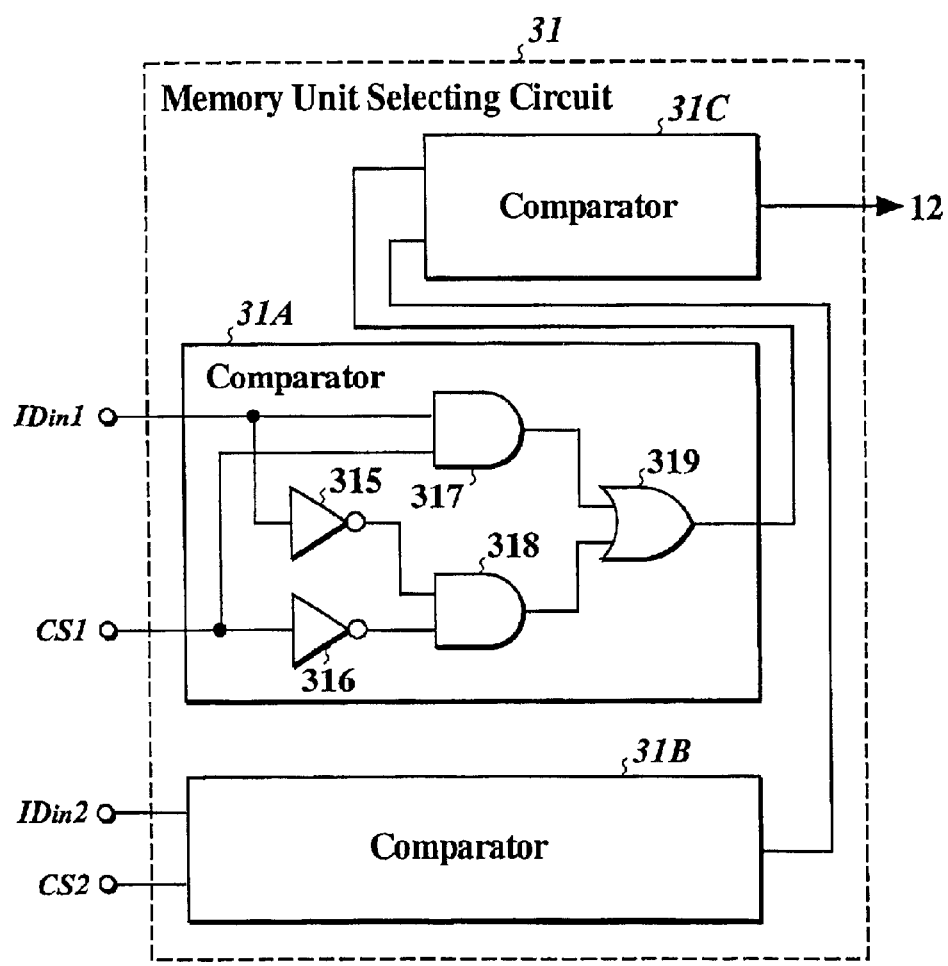
FIG. 3 is a block diagram of a memory unit selecting circuit of the identifying unit of FIG. 2(A).

Referring to FIG. 3, the memory unit selecting circuit 31 is constituted by three comparators, i.e. a comparator 31A for comparing the identifier generating signal $ID_{in}1$ with the memory unit selecting signal CS1, a comparator 31B for comparing the identifier generating signal $ID_{in}2$ with the memory unit selecting signal CS2, and a comparator circuit 31C for comparing comparison results of the comparators 31A and 31B. All of the comparators 31A, 31B and 31C are configured as identical logic circuits, and are combined with inverter circuits 315 and 316, and AND circuits 317 and 318, and an OR circuit 319. In short, any of the comparators 31A to 31C outputs the signal "1" when two input signals are in agreement. Conversely, when the two input signals are not in agreement, the comparator circuit 31A, 31B or 31C outputs the signal "0". The signal "1" which is finally outputted by the comparator circuit 31C of the memory unit selecting circuit 31 serves as the signal for selecting the memory unit 10A, and is transmitted to the command data decoding circuit 12. The signal "0" finally outputted by the comparator 31C serves as a signal for not selecting the memory unit 10B.

System Configuration of Semiconductor Module

Figure 4:
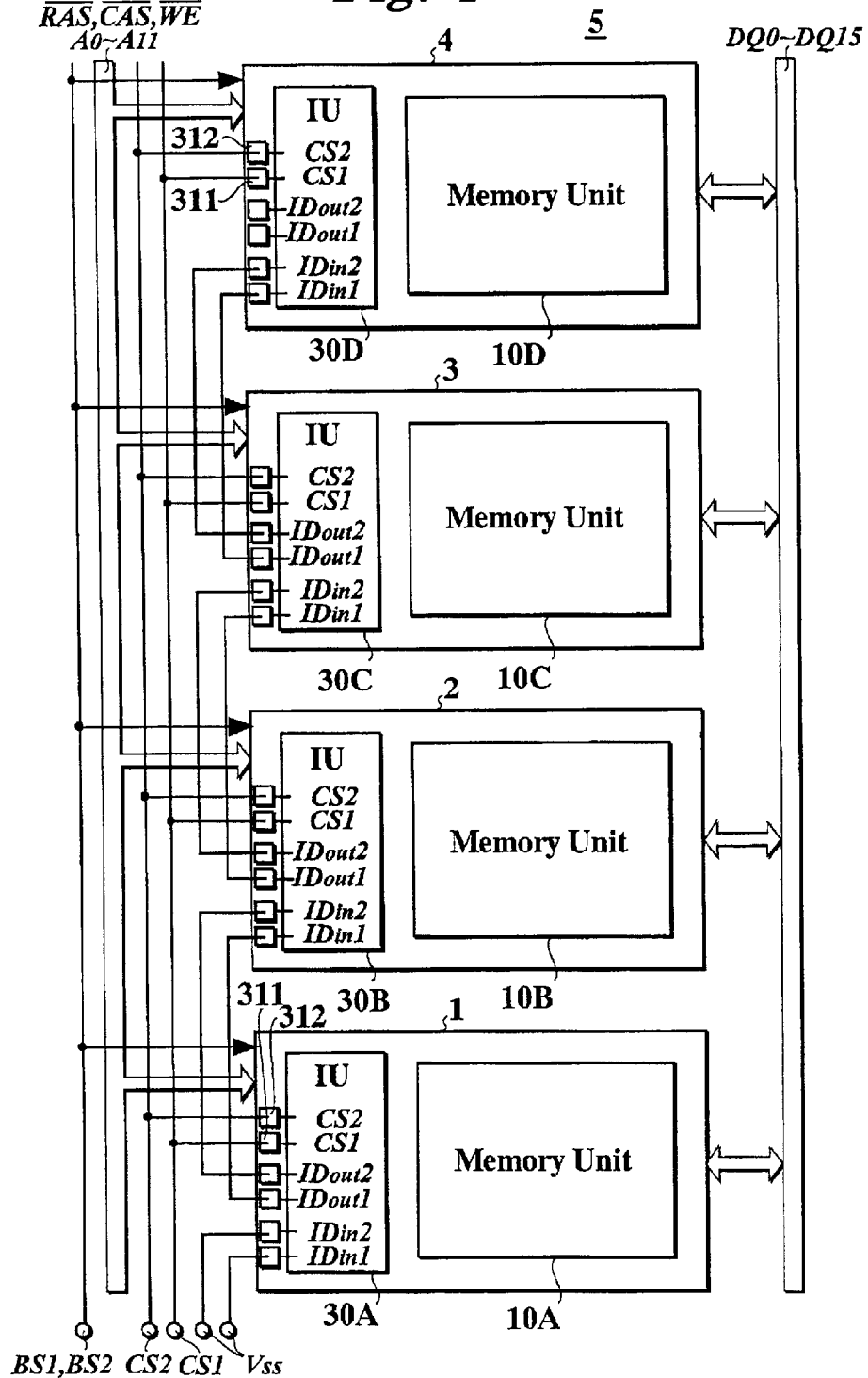
FIG. 4 is a system block diagram of a semiconductor module according to the first embodiment of the invention.

A semiconductor module 5 of the first embodiment comprises the semiconductor devices 1 to 4 as shown in FIG. 4. The semiconductor devices 2 to 4 are substantially identical to the semiconductor device 1, and are three-dimensionally stacked one over after another on the semiconductor device 1. Further, the semiconductor module 5 includes the memory units 10A to 10D of the semiconductor devices 1 to 4.

As described above, the semiconductor device 1 includes the memory unit 10A, the selecting signal terminals 311 and 312 for receiving the common memory unit selecting signals CS1 and CS2, and the identifying unit 30A. The semiconductor devices 2 to 4 include the memory units 10B to 10D, selecting signal terminals 311 and 312, and identifying units 30B to 30D, respectively.

When the semiconductor device 1 is in operation, the identifier input terminals 321 and 322 are electrically connected to a standard voltage supply Vss for supplying a 0(zero) V ground voltage, for example. Referring to FIG. 2(A) and FIG. 2(B), the signals "0" as the identifier generating signals $ID_{in}1$ and $ID_{in}2$ are inputted to the identifier input terminals 321 and 322. In short, the identifier "0,0" is assigned to the memory unit 10A. The identifier generating circuit 32 of the memory unit 10A adds a half bit to the identifier "0,0", thereby producing another identifier "0,1", which is then sent to the identifier input terminals 321 and 322 of the semiconductor device 2 via the identifier output terminals 323 and 324. The identifier "0,1" is assigned to the memory unit 10B of the semiconductor device 2. Similarly, the identifiers "1,0" are assigned to the memory units 10C of the semiconductor devices 3, and the identifiers "1,1" are assigned to the memory units 10D of the semiconductor devices 4. These identifiers "0,0", "0,1", "1,0" and "1,1" are automatically produced by the identifying units 30A to 30D when the standard voltage supply Vss is connected to the semiconductor device 1.

The identifier for the semiconductor device 1 does not always have to be "0,0". In other words, the semiconductor device 1 may have the identifier "0,1", "1,0" or "1,1". In such a case, when the semiconductor device 1 is in operation, the circuit operation voltage Vcc of approximately 3.3 V to 5 V which corresponds to the identifier "1" is applied to the identifier input terminal 321 or 322. For instance, when the identifier "0,1" is assigned to the semiconductor device 1, the identifiers "1,0", "1,1" and "0,0" will be automatically assigned to the semiconductor devices 2 to 4, respectively.

Accordingly, no a special external unit as a memory controller and so on is necessary in order to automatically generate identifiers for distinguishing the selected memory unit (e.g. the memory unit 10A) from the other memory units (e.g. the memory units 10B to 10D). Further, no special program which stored to the memory controller and so on is required in order to individually assign the identifiers to the memory units. This is effective in utilizing an existing circuit system.

First Structure of Semiconductor Module

Figure 5:
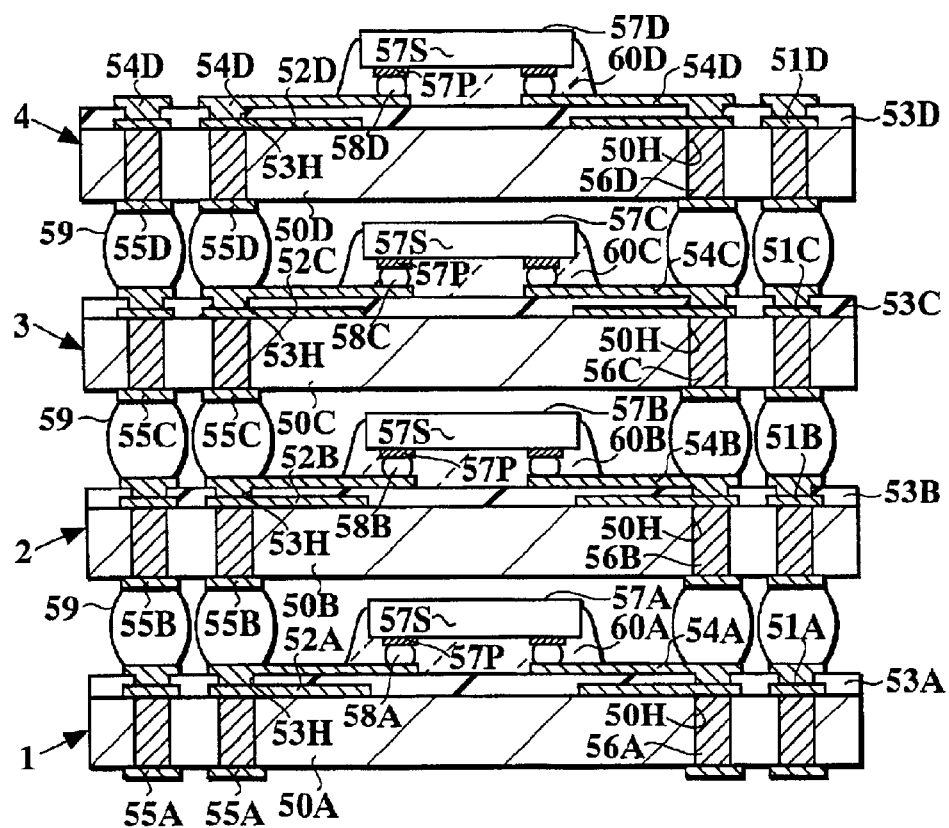
FIG. 5 is a cross section of a semiconductor module in which a plurality of semiconductor devices of a flip chip structure are stacked, according to the first embodiment.

The following describe a semiconductor module 5 in which a plurality of semiconductor devices of the flip-chip structure are stacked. As shown in FIG. 5, the semiconductor module 5 is constituted by the semiconductor devices 1 to 4 which are stacked one over after another with the semiconductor device 1 at the bottom.

The semiconductor device 1 includes at least a package substrate 50A, a semiconductor chip 57A mounted on the package substrate 50A by the flip-chip structure, and a protecting resin film 60A extending over the semiconductor chip 57A in order to protect it against surroundings.

The package substrate 50A is made of an insulating material such as epoxy resin or ceramics and so on, and is provided with front electrodes 51A and rear electrodes 55A on the opposite surfaces thereof, and two wiring layers 52A and 54A on the front surface thereof. The number of wiring layers is variable. The front and rear electrodes 51A and 55A are electrically connected via a connecting hole 50H in the package substrate 50A. The front electrode 51A and the first wiring layer 52A are flush with each other and are made of the same conductive material. The second wiring layer 54A is arranged on the first wiring layer 52A via an inter-layer insulating layer 53A, and is electrically connected to the first wiring layer 52A via a connecting hole 53H in the inter-layer insulating layer 53A. The front and rear electrodes 51A and 55A, and the first and second wiring layers 52A and 54A are made of conductive materials such as copper, copper alloy and so on.

Figure 6:
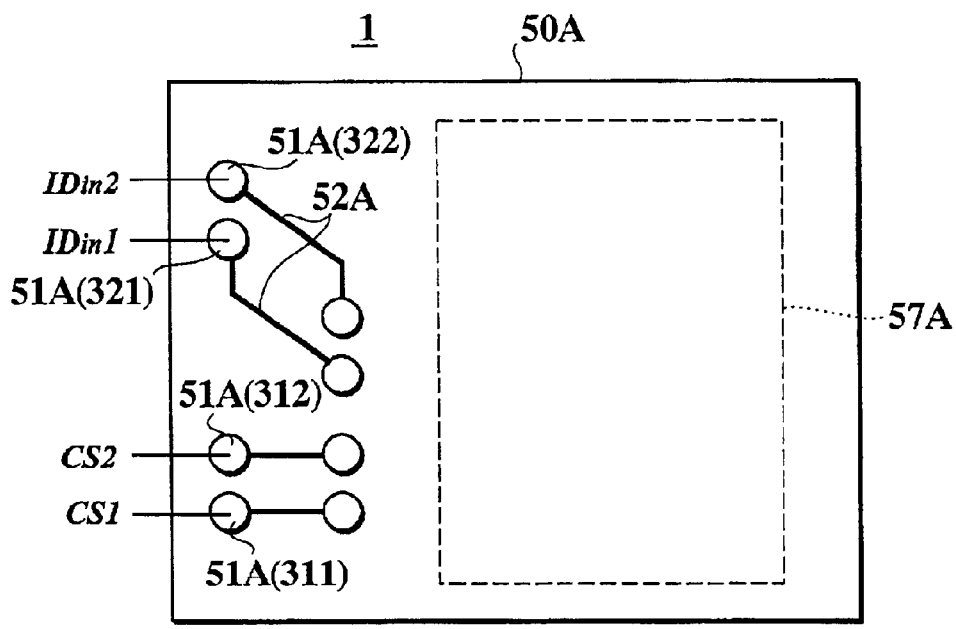
FIG. 6(A) is a schematic plan view showing a package substrate and a first wiring pattern of the semiconductor module in FIG. 5.
FIG. 6(B) is a schematic plan view showing a package substrate and a second wiring pattern of the semiconductor module in FIG. 5.
Figure 6:
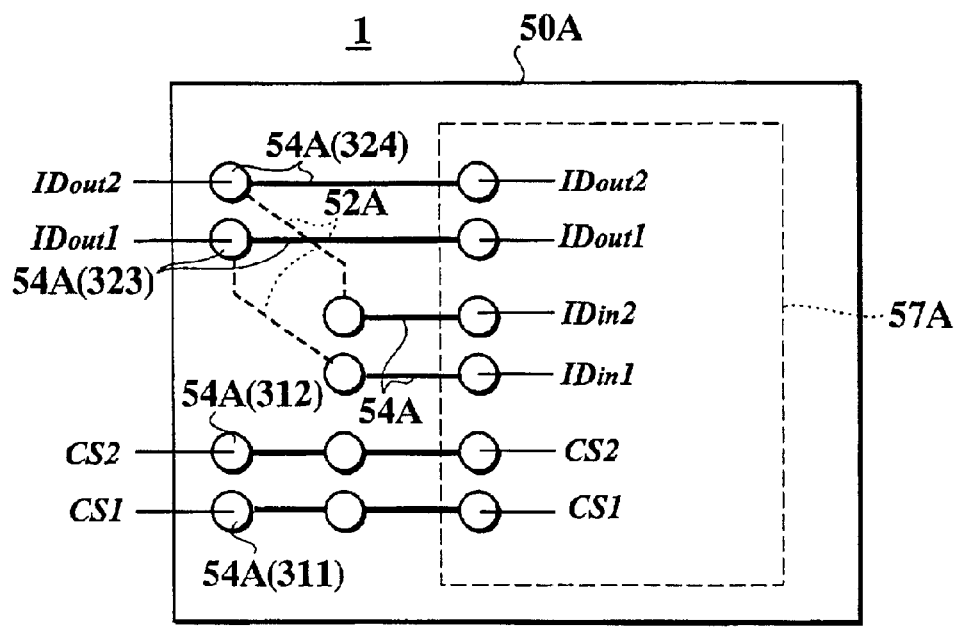

FIG. 6(A) and FIG. 6(B) schematically show arrangement patterns of only the front electrode 51A and the first and second wiring layers 52A and 54A which are used to send the memory unit selecting signals CS1 and CS2 and the identifier generating signals $ID_{in}1$, $ID_{in}2$, $ID_{out}1$ and $ID_{out}2$. In short, the memory unit selecting signals CS1 and CS2 and the identifier generating signals $ID_{in}1$ and $ID_{in}2$ are supplied to the semiconductor chip 57A via the rear electrode 55A, front electrode 51A, first wiring layer 52A and second wiring layer 54A. The identifier generating signals $ID_{out}1$ and $ID_{out}2$ are supplied to a rear electrode 55B of a package substrate 50B of the semiconductor device 2 on the first semiconductor device 1 (see FIG. 5).

The semiconductor chip 57A is made of a single crystal silicon substrate (single crystal silicon chip) 57S, and has, on an element forming surface thereof, at least the memory unit 10A and identifying unit 30A (shown in FIG. 1). The element forming surface is of the flip-chip structure, and is mounted in a face-down state (i.e. facing with the front surface of the package substrate 50A). In other words, a bonding pad 57P of the semiconductor chip 57A is electrically and mechanically connected to the second wiring layer 54A of the package substrate 50A via a bump electrode 58A. The bump electrode 58A is preferably a solder bump electrode, a gold bump electrode or the like.

The protecting resin film 60A protects the element forming surface of the semiconductor chip 57A against the intrusion of water (moisture), heavy metal and so on, and is made by potting polyimide group resin, for example.

The semiconductor devices 1 to 4 are essentially identical. Hereinafter, the letter "A" attached to the components of the semiconductor device 1, the letters "B, C and D" are attached to the components of the semiconductor devices 2 to 4, respectively. Therefore, no further detailed description thereof will be made here. For instance, the semiconductor chips are assigned reference numerals 57A, 57B, 57C and 57D in the semiconductor devices 1 to 4, respectively.

The semiconductor module 5 is structured as follows. The rear electrode 55B of the package substrate 50B of the semiconductor device 2 is electrically and mechanically connected, via a bump electrode 59, on the second wiring layer 54A (which is used at one end as a surface electrode similarly to the front electrode 51A) of the package substrate 50A of the semiconductor device 1. The rear electrode 55C of the package substrate 50C of the semiconductor device 3 is electrically and mechanically connected, via another bump electrode 59, on the second wiring layer 54B of the package substrate 50B of the second semiconductor device 2. The rear electrode 55D of the package substrate 50D of the semiconductor device 4 is electrically and mechanically connected, via another bump electrode 59, on the second wiring layer 54B of the package substrate 50C of the third semiconductor device 3. In the semiconductor devices 1 to 4, the wirings 54A, 54B, 54C and 54D (front electrodes) are aligned, and the rear electrodes 55A, 55B, 55C and 55D are aligned. The bump electrodes 59 are preferably solder bump electrodes.

In the first embodiment, "the selecting signal terminals" of the invention are the selecting signal terminals 311 and 312 in semiconductor device 1 shown in FIG. 1. In the packaged semiconductor device 1 of FIG. 5, "the selecting signal terminals" are the rear electrode 55A to which the memory unit selecting signals CS1 and CS2 are sent at first, and the second wiring layer (front electrode) 54A via which the memory unit selecting signals CS1 and CS2 are finally outputted.

Alternatively, each of the package substrates 50A, 50B, 50C and 50D of the semiconductor devices 1 to 4 may be provided with one front wiring layer and one rear wiring layer on the opposite surfaces thereof, respectively.

Second Structure of Semiconductor Module

Figure 7:
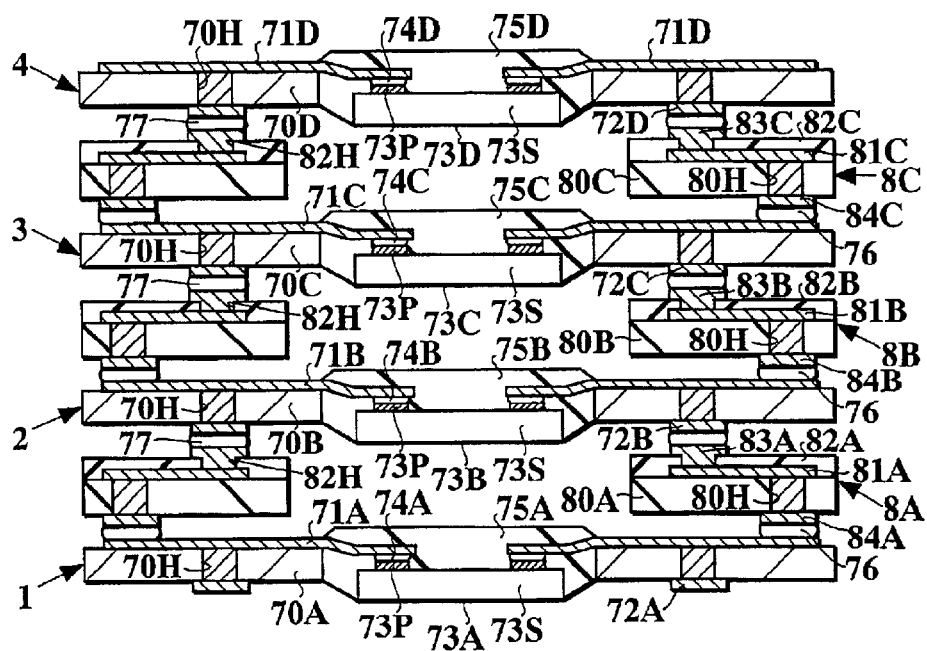
FIG. 7 is a cross section of a semiconductor module in which a plurality of semiconductor devices of a tape carrier package structure are stacked, according to the first embodiment.

The following describes a semiconductor module 5 which includes a plurality of stacked semiconductor devices of a tape carrier package structure (TCP). Referring to FIG. 7, the semiconductor module 5 has the semiconductor devices 1 to 4 stacked one over after another with the semiconductor device 1 at the bottom.

The semiconductor device 1 includes at least a base substrate 70A, a semiconductor chip 73A mounted on the base substrate 70A using the tape carrier structure, and a resin seal 75A for protecting the semiconductor chip 73A against the surroundings.

The base substrate 70A is a so-called insulated wiring board made of a material such as inflexible epoxy group resin or flexible polyimide group resin, and includes a lead wiring 71A and a rear electrode 72A on its front and rear surfaces, respectively. The lead wiring 71A and rear electrode 72A are electrically connected via a connecting hole 70H in the base substrate 70A, and are mainly made of a conductive material such as copper, a copper alloy or the like. Alternatively, the lead wiring 71A is made of a popular iron-nickel alloy such as 42 alloy (42 atoms % Ni—Fe alloy) or 50 alloy (50 atoms % Ni—Fe alloy) or the like.

The semiconductor chip 73A is a single crystal silicon substrate 73S, or example, similarly to the semiconductor chip 57A described with respect to the first structure of the semiconductor module. The semiconductor chip 73A includes at least the memory unit 10A and identifying unit 30A on its element forming surface, as shown in FIG. 1. The element forming surface is mounted in a face-up manner, as shown in FIG. 7. Specifically, a bonding pad 73P of the semiconductor chip 73A is electrically and mechanically connected to an underside of an inner lead (finger lead) of the lead wiring 71A of the base substrate 70A. The bump electrode 74A is preferably a solder bump electrode, a gold bump electrode or the like.

The resin seal 75A seals the semiconductor chip 73A in order to protects the element forming face thereof against water and contaminant such as heavy metal or the like, and is made of thermosetting epoxy group resin which is transfer-molded (resin-molded).

The semiconductor devices 1 to 4 are essentially identical, and are not described in detail here. The letters A, B, C and D are added to the reference numerals of their components. For instance, the semiconductor chips are assigned reference numerals 73A, 73B, 73C and 73D in the semiconductor devices 1 to 4, respectively.

The semiconductor devices 1 and 2 are electrically and mechanically connected via an intermediate wiring board (e.g. printed wiring board) 8A provided therebetween. The semiconductor devices 2 and 3 are electrically and mechanically connected via an intermediate wiring board 8B.

Further, the semiconductor devices 3 and 4 are electrically and mechanically connected via an intermediate wiring board 8C.

The intermediate wiring board 8A includes at least an insulated substrate 80A, a first wiring layer 81A on the front surface of the insulated substrate 80A, a second wiring layer 83A on the front wiring layer 81A, and a rear electrode 84A on the rear surface of the insulated substrate 80A. Specifically, the second wiring layer 83A is arranged on the first wiring layer 81A via an inter-layer insulating layer 82A, and is electrically connected to the first wiring layer 81A via a connecting hole 82H in the inter-layer insulating layer 82A. The first wiring layer 81A is connected to the rear electrode 84A via a connecting hole 80H in the insulated substrate 80A. The insulated substrate 80A is made of a wiring board material such as epoxy group resin, ceramics or the like. The first and second wiring layers 81A and 83A, and the rear electrode 84A are made of a conductive material such as copper, a copper alloy or the like.

The rear electrode 84A is electrically and mechanically connected to a lead wiring 71A of the semiconductor device 1 via a bump electrode 76. The second wiring layer 83A is electrically and mechanically connected to a rear electrode 72B of the semiconductor device 2 via a bump electrode 77. The bump electrodes 76 and 77 are preferably solder bump electrodes, for example.

The intermediate wiring boards 8B and 8C of the semiconductor devices 2 and 3 are substantially identical to the intermediate wiring board 8A of the semiconductor device 1. Therefore, the letters B and C are added to the reference numerals of the components in the semiconductor devices 2 and 3.

Figure 8:
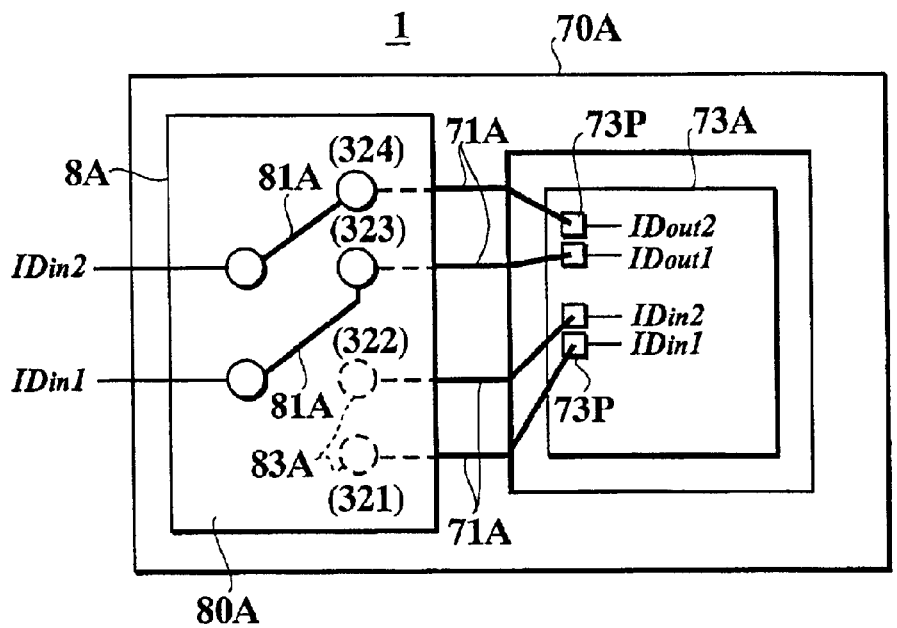
FIG. 8(A) is a schematic plan view showing a first wiring pattern of an intermediate wiring board between upper and lower semiconductor devices of the semiconductor module of FIG. 7.
FIG. 8(B) is a schematic plan view showing a second wiring pattern of the intermediate wiring board in the semiconductor module of FIG. 7.
Figure 8:
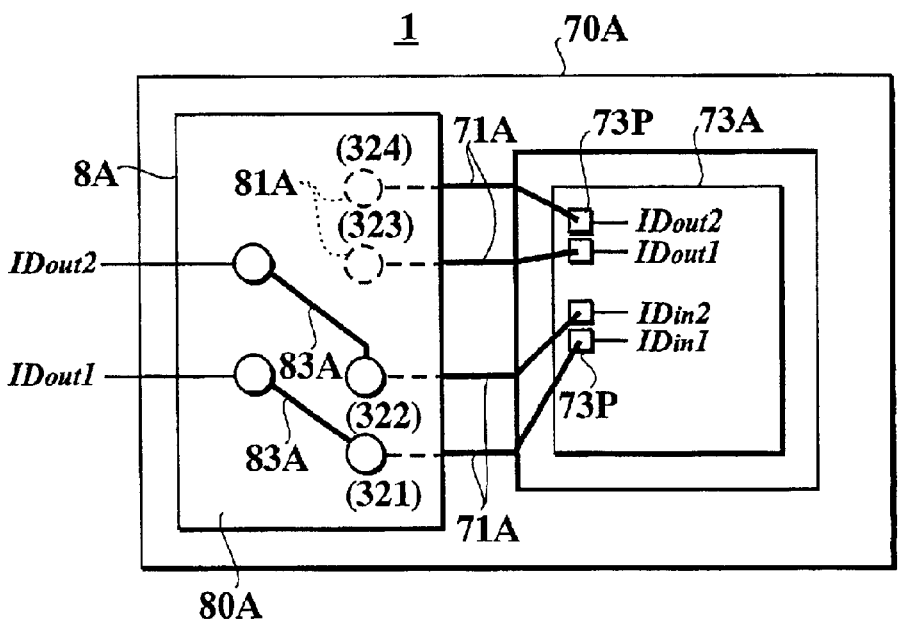

FIG. 8(A) and FIG. 8(B) schematically show wiring patterns of the first and second wiring layers 81A and 83A for supplying the identifier generating signals $ID_{in}1$, $ID_{in}2$, $ID_{out}1$ and $ID_{out}2$. Specifically, the identifier generating signals $ID_{out}1$ and $ID_{out}2$ are outputted from the bonding pad 73P (i.e. identifier output terminals 323 and 324) of the semiconductor chip 73A, are sent to the rear electrode 84A of the intermediate wiring board 8A via the lead wiring 71A and bump electrode 76, and are then supplied to the rear electrode 72B of the base substrate 70B of the semiconductor device 2 via the first and second wiring layers 81A and 83A (shown in FIG. 8(A) and FIG. 8(B)), respectively (see FIG. 7).

Bank Active Operation, Data Write Operation and Data Read Operation

Figure 9:
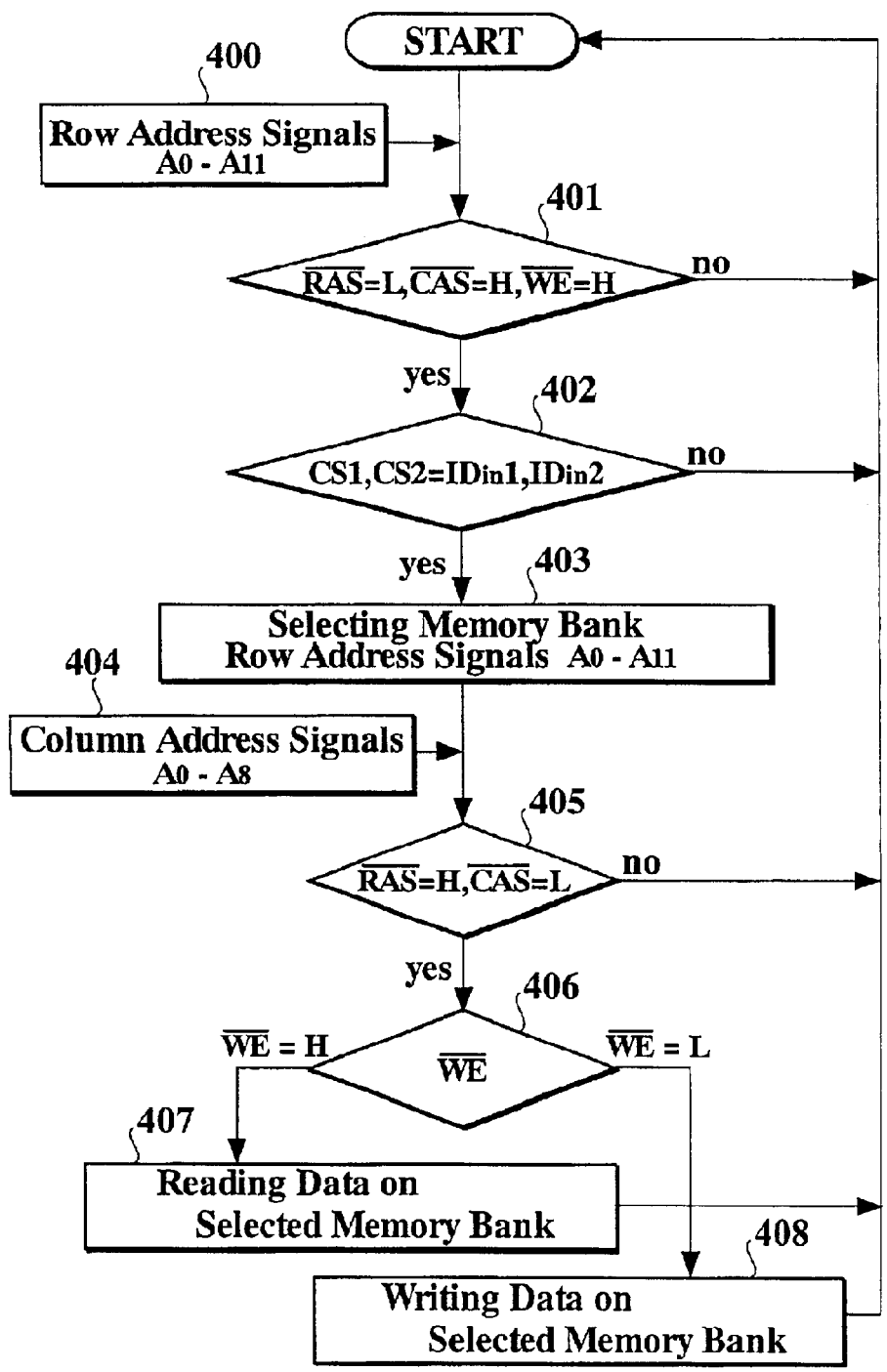
FIG. 9 is a flow chart showing the data writing and reading in the semiconductor device and the semiconductor module according to the first embodiment.

Referring to FIG. 9, the data writing and reading will be described with respect to the semiconductor devices 1 to 4 in the semiconductor module 5. It is assumed here that the semiconductor device 1 of the semiconductor module 5 is activated in order to write and read data in and from the memory unit 10A.

(1) Bank Active Operation

First of all, in the semiconductor device 1 of FIG. 1, the address signals $A_0$ to $A_{11}$ are inputted in the address buffer circuit 14, and the 12-bit row address signals RAS are determined on the basis of these address signals $A_0$ to $A_{11}$ (in step 400 in FIG. 9). The row address strobe signal RAS, column address strobe signal CAS and write enable signal WE are inputted to the command decoding circuit 12. These signals are commonly inputted to the semiconductor devices 1 to 4 constituting the semiconductor module 5.

When the row address strobe signal RAS has the low level "L", the column address strobe signal CAS has the high level "H", and the write enable signal WE has the high level "H" (in step 401), the identifier produced in response to the memory unit selecting signals CS1 and CS2 and the identifier produced by the identifier generating circuit 32 are compared by the memory unit selecting unit 31 of the identifying unit 30A, in order to determine the activation or non-activation of the memory unit 10A (in step 402).

In the semiconductor device 1, the signals "0" are inputted as the identifier generating signals $ID_{in}1$ and $ID_{in}2$, and the identifier "0,0" is determined. Therefore, when the signals "0" are inputted as the memory unit selecting signals CS1 and CS2, the identifier "0,0" and the memory unit selecting signal "0,0" are in agreement, so that the memory unit 10A will be activated. Otherwise, the memory unit 10A will not be activated.

Thereafter, the memory bank 21, 22, 23 or 24 will be activated in response to the bank select signals BS1 and BS2 sent to the address buffer circuit 14 (in step 403). It is assumed here that the memory bank 21 is activated. If the identifier of the semiconductor device 1 and the memory unit selecting signals CS are not in agreement, i.e. if the memory unit 10A is not activated, no data will be written or read regardless of the activation of the memory bank 21. The row address signal is inputted to the activated memory bank 21.

(2) Data Write Operation and Data Read Operation

The activated memory bank 21 receives the 8-bit column address signals CAS in response to the address signals $A_0$ to $A_7$ inputted to the address buffer circuit 14 (in step 404). The row address strobe signal RAS, column address strobe signal CAS and write enable signal WE are inputted to the command decoding circuit 12. When the row strobe signal RAS has the high level "H", the column strobe signal CAS has the low level "L", and the write enable signal WE has the high level "H" (in steps 405 and 406), data which has been stored in the memory cell of the address specified by the row address signal RAS and column address signal CAS is read in the memory cell array 200 of the memory bank 21 (in step 407). The data output buffer circuit 19 outputs the read data as a data signal DQ. On the other hand, if the write enable signal WE has the low level "L", the data in a memory cell of the address determined by the row address signal RAS and the column address signal CAS is written in the memory cell array 200 (in step 408). The data written into the memory cell is inputted to the data output buffer circuit 19 as the data signal DQ.

The memory unit 10A of the semiconductor device 1 where the data should be written into and read from is activated on the basis of the identifier "0,0" supplied by the identifying unit 30A and the memory unit selecting signals CS1 and CS2. The memory unit 10B of the semiconductor device 2 is activated on the basis of the identifier "0,1" specified by the identifying unit 30B and the memory unit selecting signals CS1 and CS2. The memory unit 10C of the semiconductor device 3 is activated on the basis of the identifier "1,0" specified by the identifying unit 30C and the memory unit selecting signals CS1 and CS2. The memory unit 10D of the semiconductor device 4 is activated on the basis of the identifier "1,1" specified by the identifying unit 30D and the memory unit selecting signals CS1 and CS2.

In the semiconductor devices 1 to 4, the memory units 10A to 10D are identified by the identifying units 30A to 30D on the basis of the common memory unit selecting signals CS1 and CS2 supplied via the selecting signal terminals 311 and 312, which is effective in reducing the number of the selecting signal terminals 311 and 312, and enabling the selecting signal terminals 311 and 312 to have the identical structure in the memory units 10A to 10D. As a result, the semiconductor devices 1 to 4 can be downsized in response to the reduced number of the selecting signal terminals CS1 and CS2, and can have the memory units 10A to 10D stacked therein.

Further, the memory units 10A to 10D of the semiconductor devices 1 to 4 can be easily activated on the basis of their identifiers and the memory unit selecting signals CS1 and CS2. Still further, for instance, the identifier "0,0" of the memory unit 10A can be used in order to automatically produce the identifier "0,1" of the memory unit 10B on the memory unit 10A. Similarly, the identifier "0,1" of the memory unit 10B can be used in order to automatically produce the identifier "1,0" of the memory unit 10C on the memory unit 10B, and the identifier "1,0" of the memory unit 10C can be used in order to automatically produce the identifier "1,1" of the memory unit 10D on the memory unit 10C.

The memory units 10A to 10D (i.e. the semiconductor devices 1 to 4) can be stacked in order to constitute the semiconductor module 5, which is effective in increasing the storage capacity and improving mounting density of components. Alternatively, if the semiconductor module 5 may include 8, 16, 32 or 64 of semiconductor devices which are stacked one over after another, the number of selecting signal terminals can be reduced extensively.

It is also possible to juxtapose the semiconductor devices 1 to 4 and the memory units 10A to 10D in place of stacking them.

Second Embodiment

System Configuration of Semiconductor Module

In a second embodiment of the invention, surplus address signal terminals (or a surplus signal lines) of the address signal terminals of the semiconductor devices 1 to 4 or the semiconductor module 5 are used for receiving a memory unit selecting signal CS.

Figure 10:
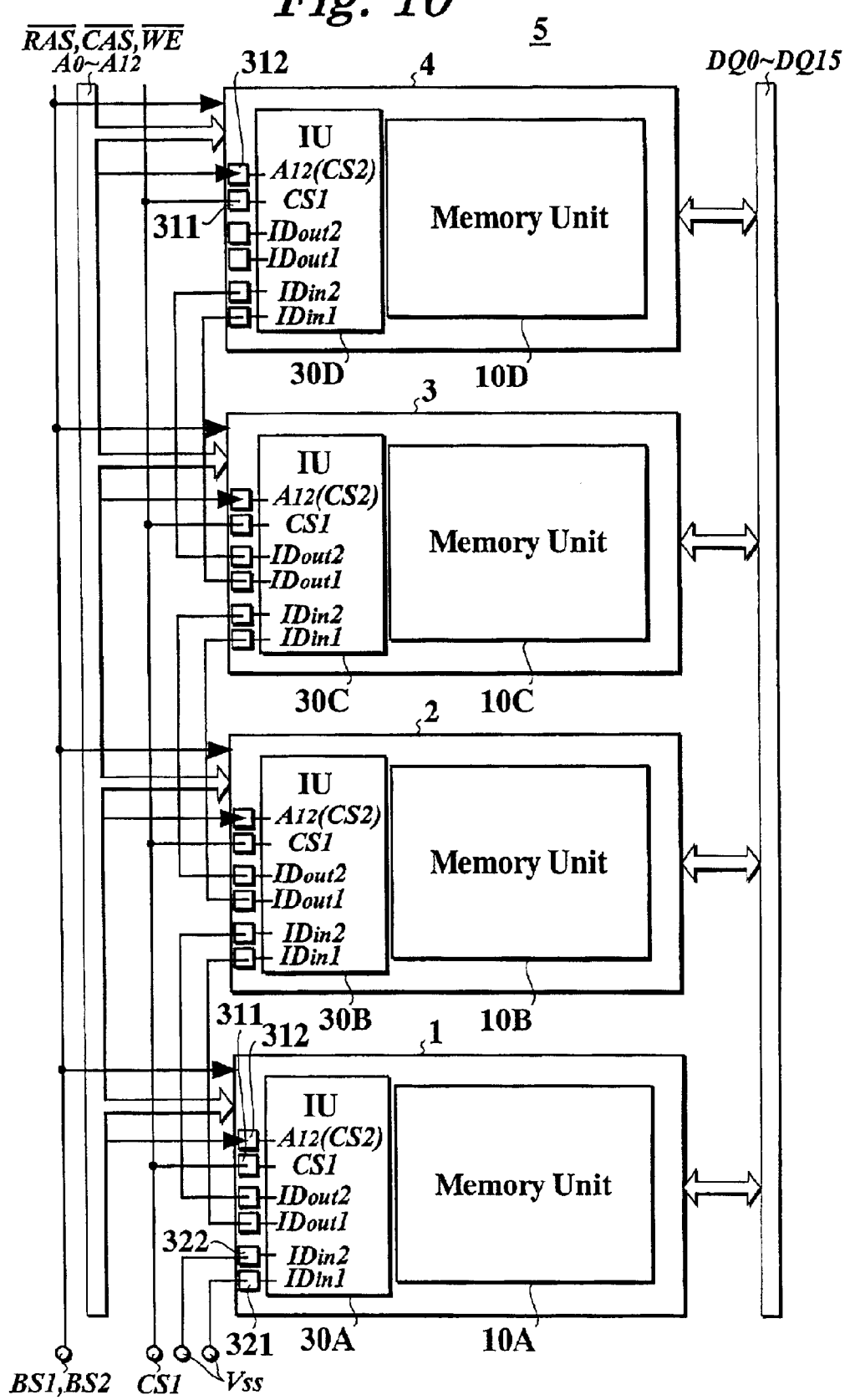
FIG. 10 is a system block diagram of a semiconductor module according to a second embodiment of the invention.

Referring to FIG. 10, a semiconductor module 5 of this embodiment is identical to the semiconductor module 5 shown in FIG. 4, and includes semiconductor devices 1 to 4 which are identical and are stacked one over after another with the semiconductor device 1 at the bottom. Memory units 10A to 10D of the semiconductor devices 1 to 4 are three-dimensionally stacked one over after another.

The semiconductor device 1 is provided with one selecting signal terminal 311 for effectively receiving the common 1-bit memory unit selecting signal CS1. And a surplus address signal terminal 312 out of the common address signal terminals is used for receiving the common 1-bit memory unit selecting signal CS2. Each of the semiconductor devices 2 to 4 is required to have only one selecting signal terminal 311 for receiving the common memory unit selecting signal CS1, and surplus address signal terminals 312 out of the common address signal terminals are used for receiving the memory unit selecting signal CS2.

Each of the memory units 10A to 10D includes a total of 13 address signal terminals for receiving the address signals $A_0$ to $A_{12}$. The address signals $A_0$ to $A_{11}$ are actually used as the row address signals RAS. In other words, the address signal terminal related to the address signal $A_{12}$ is not in use. More specifically, the address signals $A_0$ to $A_7$ are used as the column address signals CAS. As a result, the address signal terminals related to the remaining address signals are out of use. In the semiconductor devices 1 to 4 of the second embodiment, the address signal $A_{12}$ and the address signal terminals for receiving it are used as the common memory unit selecting signal CS2 and as selecting signal terminals 312 for receiving this common memory unit selecting signal CS2.

Bank Active Operation, Data Write Operation and Data Read Operation

Figure 11:
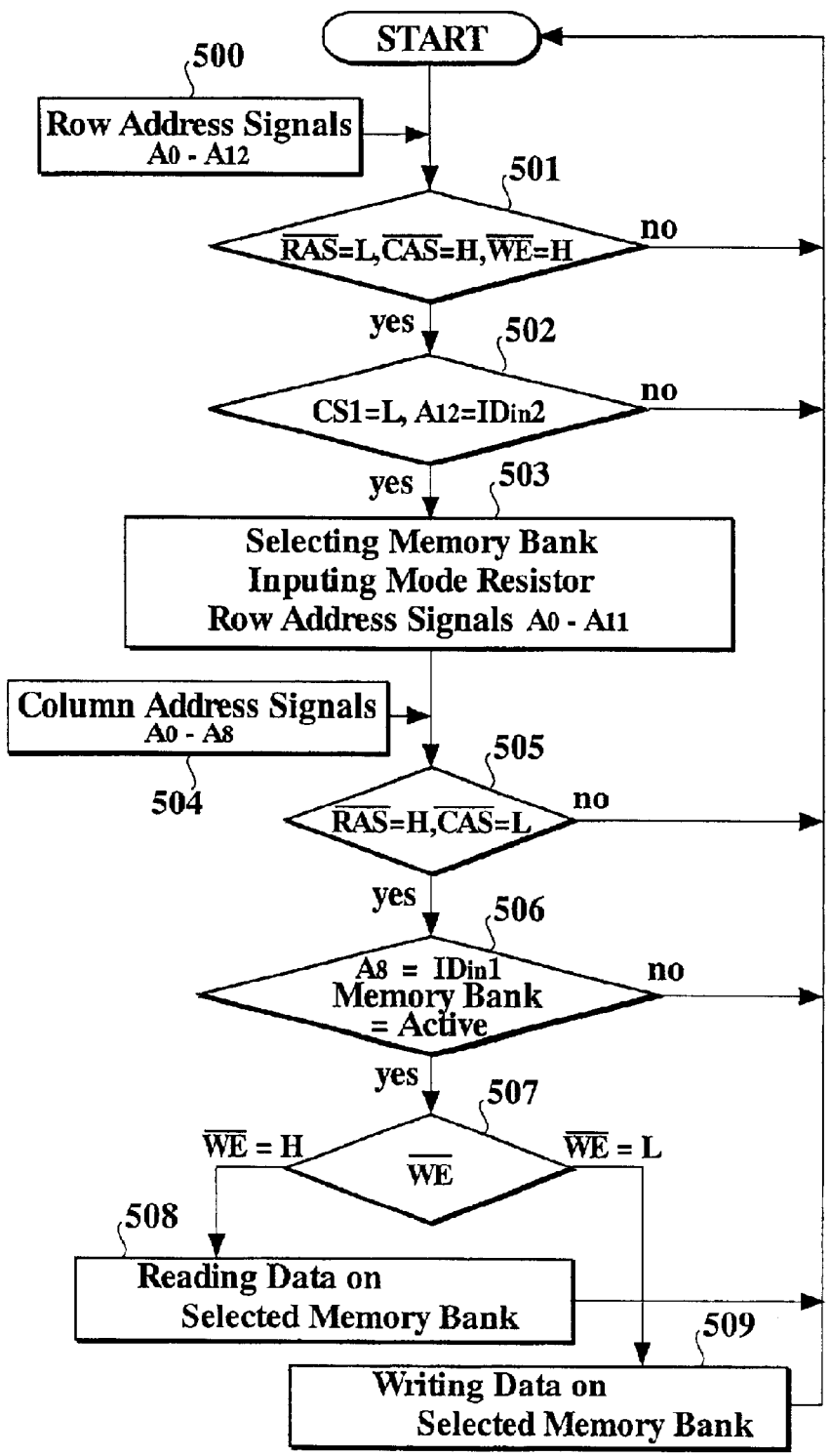
FIG. 11 is a flow chart showing the data writing and reading in the semiconductor device and semiconductor module according to the second embodiment.
Figure 12:
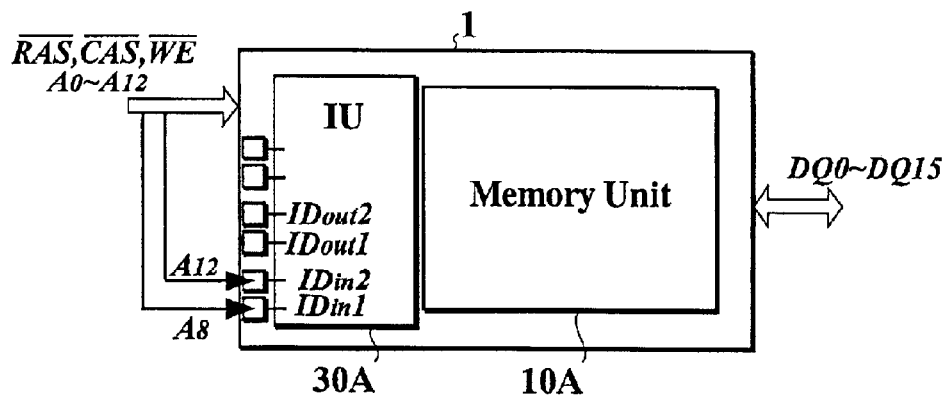
FIG. 12 is a block diagram of a semiconductor device in a modified example of the second embodiment.

Data are written in and read from the semiconductor devices 1 to 4 in the semiconductor module 5 as follows with reference to FIG. 11. It is assumed here that the semiconductor 1 is activated, and that the memory unit 10A writes and reads the data.

(1) Bank Active Operation

In the semiconductor device 1, the address signals $A_0$ to $A_{12}$ are inputted to the address buffer circuit 14 (refer to FIG. 1). The 13-bit row address signals RAS are produced on the basis of these address signals $A_0$ to $A_{12}$ (in step 500 in FIG. 11). The command decoding circuit 12 receives the row address strobe signal RAS, column address strobe signal CAS and write enable signal WE. By the way, all of the foregoing signals are commonly inputted to the semiconductor devices 1 to 4. In other words, the semiconductor devices 2 to 4 also receive them.

When the row address strobe signal RAS has the low level "L", the column address strobe signal CAS has the high level "H" and the write enable signal WE has the high level "H" (in step 501), the memory unit selecting circuit 31 of the identifying unit 30A determines the activation or non-activation of the memory unit 10A (in step 502), as shown in FIG. 10 (and FIGS. 1, 2(A) and 3). Specifically, the memory unit selecting circuit 31 determines the activation or non-activation of the memory unit 10A on the basis of the memory unit selecting signal CS1, the address signal $A_{12}$ used in place of the memory unit selecting signal CS2, and the identifier produced in response to the identifier generating signals $ID_{in}1$ and $ID_{in}2$.

Thereafter, the address buffer circuit 14 receives the bank selecting signals BS1 and BS2 (in step 503), on the basis of which one of the memory banks 21 to 24 (shown in FIG. 1) will be activated. It is assumed here that the memory bank 21 is activated. If the identifier of the semiconductor device 1 does not agree with the memory unit selecting signal CS1, i.e. if the memory unit 10A is not activated, no data will be written or read. In this state, the data concerning the activation of the memory bank 21 in response to the bank selecting signals BS1 and BS2 is stored in a mode register circuit 15 (shown in FIG. 15) provided in the memory unit 10A. The row address signals $A_0$ to $A_{11}$ are inputted to the activated memory bank 21.

(2) Data Write Operation and Data Read Operation

The memory bank 21 receives the 9-bit column address strobe signals CAS on the basis of the address signals $A_0$ to $A_8$ inputted to the address buffer circuit 14 (in step 504). The command decoding circuit 12 receives the row address strobe signal RAS and the column address strobe signal CAS. If the row address signals RAS have the low level "L" and the column address signal CAS have the high level "H", respectively (in step 505), the most significant column address signal $A_8$ and the identifier generating signal $ID_{in}1$ are compared, and the data stored in the mode register circuit 15 are also referred to (in step 506). When the column address signal $A_8$ agrees with the identifier generating signal $ID_{in}1$ and when the data stored in the mode register circuit 15 denotes the activation of the memory bank 21, the write enable signal WE will be inputted (in step 507). If the write enable signal WE has the high level "H", the data are read from the memory cell having the address selected in response to the row address signal RAS and the column address signal CAS, in the memory cell array 200 of the activated memory bank 21 (in step 508). The read data is outputted as the data signal DQ via the data output buffer circuit 19. On the other hand, if the write enable signal WE has the low level "L", the data is written into the memory cell having the address selected in response to the row address signal RAS and the column address signal CAS, in the memory cell array 200 (in step 509). The data written into the memory cell is transmitted to the data output buffer circuit 19 as the data signal DQ.

The memory unit 10A for which the data is written and read is activated on the basis of the identifier specified by the identifying unit 30A, and the address signal $A_{12}$ used in place of the memory unit selecting signal CS2. The memory units 10B to 10D of the semiconductor devices 2 to 4 are activated in the similar manner and are subject to the data writing and reading.

In the second embodiment, the selecting signal terminal 312 for receiving the address signal $A_{12}$ is used in order to receive the memory unit selecting signal CS2, which is effective in reducing the number of the selecting signal terminals and downsizing the semiconductor devices 1 to 4 and the semiconductor module 5.

In such semiconductor device 1, it is possible to handle the memory module which was composed by four 64-Mbit SDRAMs like one 256-Mbit SDRAM when seeing it from outside.

Applied Example

If the semiconductor devices 1 to 4 do not constitute the semiconductor module 5, the column address signal $A_8$ is used in place of the identifier generating signal $ID_{in}1$, and the row address signal $A_{12}$ is used in place of the identifier generating signal $ID_{in}2$, so that the data can be independently written and read regardless of the column address signal $A_8$ and the row address signal $A_{12}$.

Third Embodiment

In a third embodiment of the invention, the identifier generating circuits of the identifying units 30A to 30D of the semiconductor devices 1 to 4 in the semiconductor module 5, are constituted by fuse elements.

Figure 13:
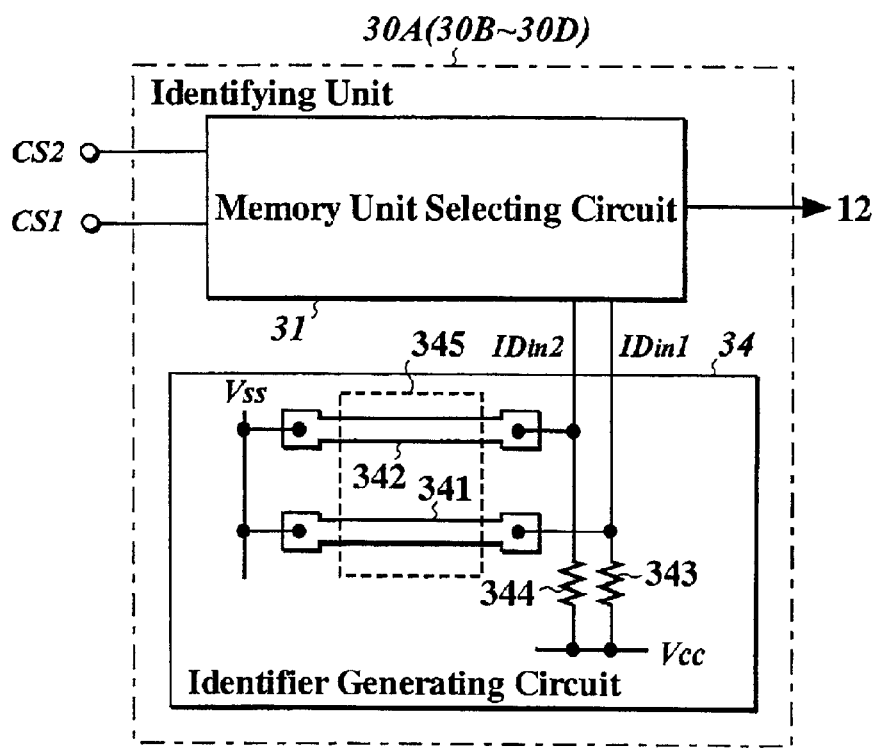
FIG. 13 is a block diagram of an identifying unit of a semiconductor device according to a third embodiment of the invention.
Figure 14:
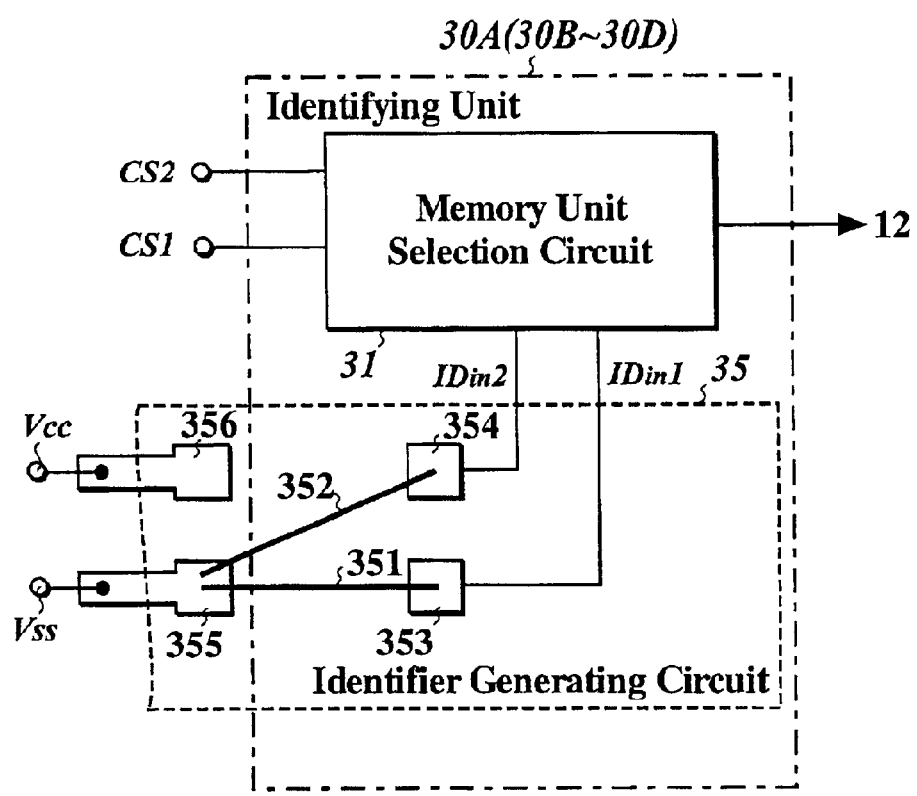
FIG. 14 is a block diagram of an identifying unit of a semiconductor device according to a fourth embodiment of the invention.

Referring to FIG. 13, the identifying unit 30A of the semiconductor device 1 includes at least: an identifier generating circuit 34, which has at least fuse elements 341 and 342 for producing an identifier to be assigned to the memory unit 10A; and a memory unit selecting circuit 31 for selecting the memory unit 10A on the basis of the identifier produced by the identifier generating circuit 34 and the memory unit selecting signals CS1 and CS2.

The memory unit selecting circuit 31 of this embodiment is identical to that of the first embodiment, and will not be described in detail.

The fuse element 341 has one end thereof electrically connected to the standard power supply Vss for supplying a 0 V ground potential, and the other end thereof electrically connected to an operation power supply Vcc, for supplying a 3.3 V circuit operation potential, via a high resistance element 343, of which resistance value is higher than resistance value of the fuse element 341, and to the memory unit selecting circuit 31. When the fuse element 341 is conductive, the standard power supply Vss supplies the signal "0" as the identifier to the memory unit selecting circuit 31 via the fuse element 341. Conversely, when the fuse element 341 is not conductive, the operation power supply Vcc supplies the signal "1" as the static identifier to the memory unit selecting circuit 31 via a high resistance element 343.

The fuse element 342 has one end thereof electrically connected to the standard power supply Vss and the other end thereof electrically connected to the operation power supply Vcc via a high resistance element 344, of which resistance value is higher than resistance value of the fuse element 342, and to the memory unit selecting unit 31. When the fuse element 342 is conductive, the standard power supply Vss supplies the signal "0" as the identifier to the memory unit selecting circuit 31 via the fuse element 342. Conversely, when the fuse element 342 is not conductive, the operation power supply Vcc supplies the signal "1" as the identifier to the memory unit selecting circuit 31 via a high resistance element 344.

In short, four kinds of identifiers "0,0", "0,1", "1,0" and "1,1" can be produced by the fuse elements 341 and 342. Each of the identifying units 30B to 30D of the semiconductor devices 2 to 4 includes the identifier generating circuits 34 having the fuse elements 341 and 342 and the memory unit selecting circuits 31. In other words, the semiconductor devices 1 to 4 are identically configured.

The memory cell for storing the 1-bit data of the DRAM is constituted by a series circuit including not only an insulated gate field effect transistor (IGFET) for memory cell activation but also a data storing capacitive element. Both of the fuse elements 341 and 342 may be made of a conductive layer (e.g. a polycrystalline silicon film, a suicide film or a polycide film and so on) which is the same as that of a gate electrode of the IGFET. The high resistance elements 343 and 344 may be made of the same conductive material as that of the gate electrode, and have a low impurity ratio in order to assure a high resistance compared with the fuse elements 341 and 342.

The fuse elements 341 and 342 can be electrically disconnected or can be disconnected using laser. In FIG. 13, reference numeral 345 denotes a fuse window which is formed in a passivation film, and is used to enable laser beams to pass through and to discharge objects which may be produced when the fuse element 341 or 342 is blown.

The semiconductor devices 1 to 4 and the semiconductor module 5 are as effective as that of the first embodiment, and are easy to produce the identifiers using the fuse terminals 341 and 342 which have a simple structure compared with a logical circuit, for example. This is effective in simplifying the identifying units 30A to 30D.

Fourth Embodiment

In a fourth embodiment of the invention, the identifying units 30A to 30D of the semiconductor devices 1 to 4 in the semiconductor module 5 of the first or second embodiment are realized by wires.

The identifying unit 30A of the semiconductor device 1 includes at least an identifier generating circuit 35 which has at least wires 351 and 352 for generating an identifier for the memory unit 10A, and a memory unit selecting circuit 31 for selecting the memory unit 10A on the basis of the identifier generated by the identifier generating circuit 35 and the memory unit selecting signals CS1 and CS2.

The memory unit selecting circuit 31 is identical to that of the first embodiment shown in FIG. 3, and will not be described here.

The wire 351 has one end thereof electrically connected to an identifier input terminal 353, which is electrically connected to the memory unit selecting circuit 31. The other end of the wire 351 is connected to a standard power supply terminal (Vss) 355 when the identifier signal is "0". Conversely, when the identifier signal is "1", the other end of the wire 351 is electrically connected to an operation power supply terminal (Vcc) 356. In other words, the wire 351 supplies the identifier generating signal $ID_{in}1$ to the memory unit selecting circuit 31 via the identifier input terminal 353.

One end of the wire 352 is electrically connected to an identifier input terminal 354, which is electrically connected to the memory unit selecting circuit 31. The other end of the wire 353 is electrically connected to the standard power supply terminal (Vss) 355 when the identifier signal is "0" or to the operation power supply terminal (Vcc) 356 when the identifier signal is "1". The wire 352 supplies the identifier generating signal $ID_{in}2$ to the memory unit selecting circuit 31 via the identifier input terminal 354.

The wires 351 and 352 are preferably made of gold bonding wire, copper bonding wire, aluminum bonding wire or the like, for example. The standard power supply terminal 355 and the operation supply terminal 356 are preferably made of bonding pads which are formed in a semiconductor chip, lead frames or lead wires which are formed outside the semiconductor chip, or the like, similarly to the identifier input terminals 353 and 354.

The wires 351 and 352 can generate four identifiers "0,0", "0,1", "1,0" and "1,1". Each of the identifying units 30B to 30D of the semiconductor devices 2 to 4 in the semiconductor module 5 includes the identifier generating circuit 35 having the wires 351 and 352, and the memory unit selecting circuits 31.

The semiconductor devices 1 to 4 and semiconductor module 5 of this embodiment is not only as advantageous as the semiconductor devices 1 to 4 and the semiconductor module 5 of the first embodiment but also includes the simplified identifying units 30A to 30D in which the identifiers can be generated using the wires 351 and 352 that are simple compared with a logical circuit.

Fifth Embodiment

Figure 15:
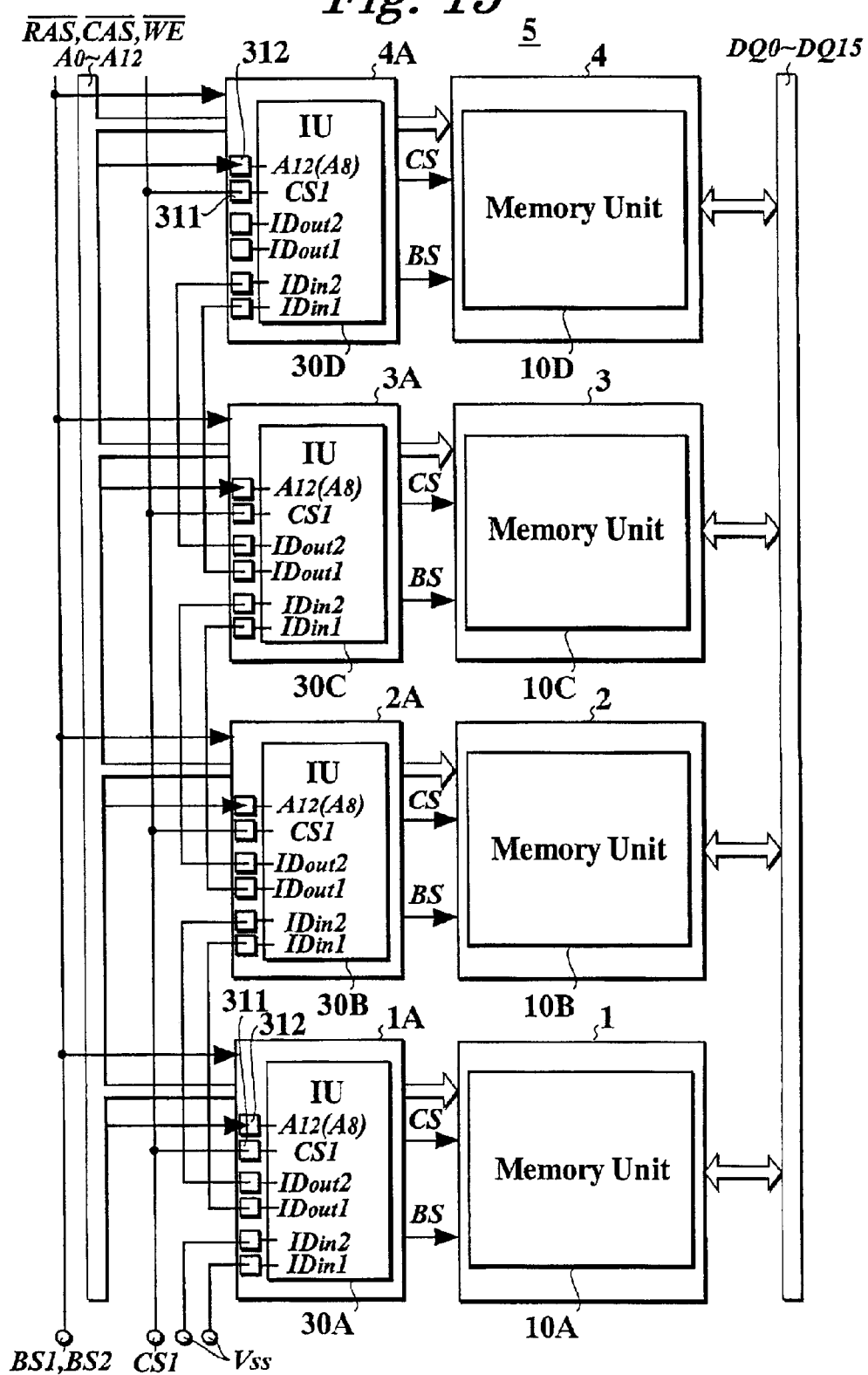
FIG. 15 is a system block diagram of a semiconductor module according to a fifth embodiment of the invention.
Figure 16:
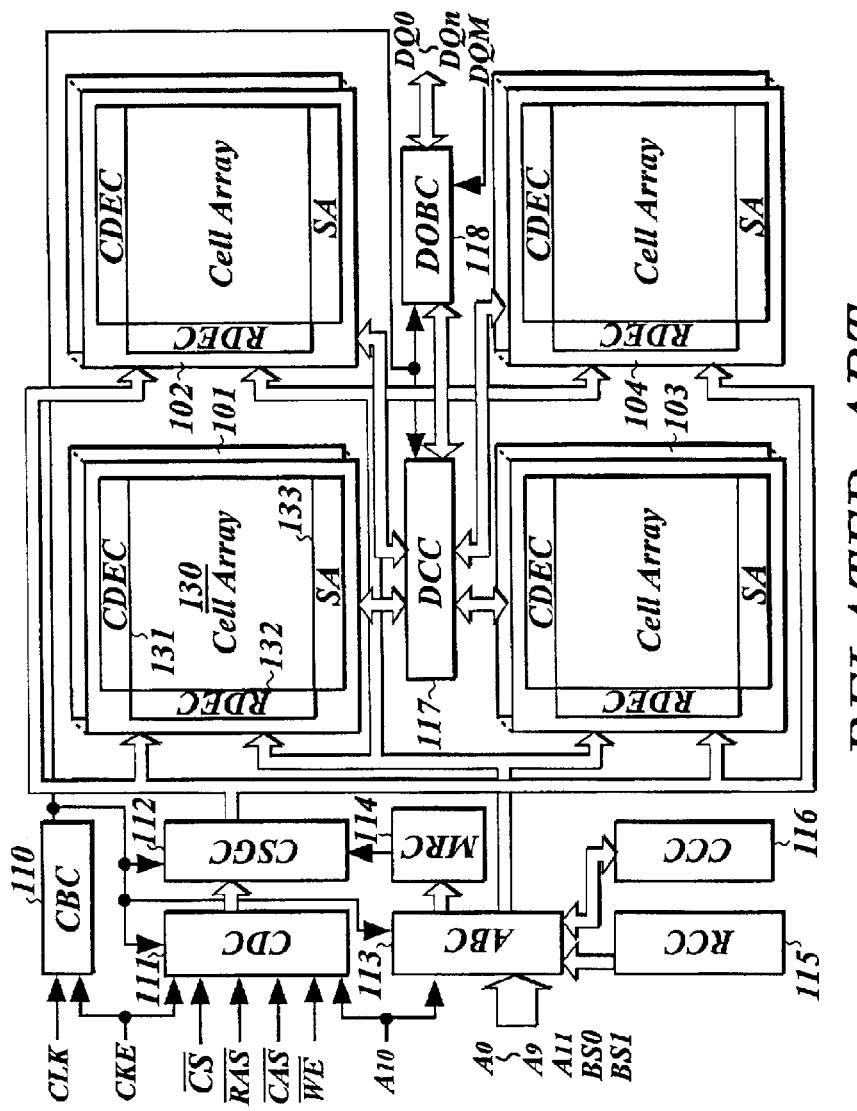
FIG. 16 is a block diagram of a DRAM system of the related art.
Figure 17:
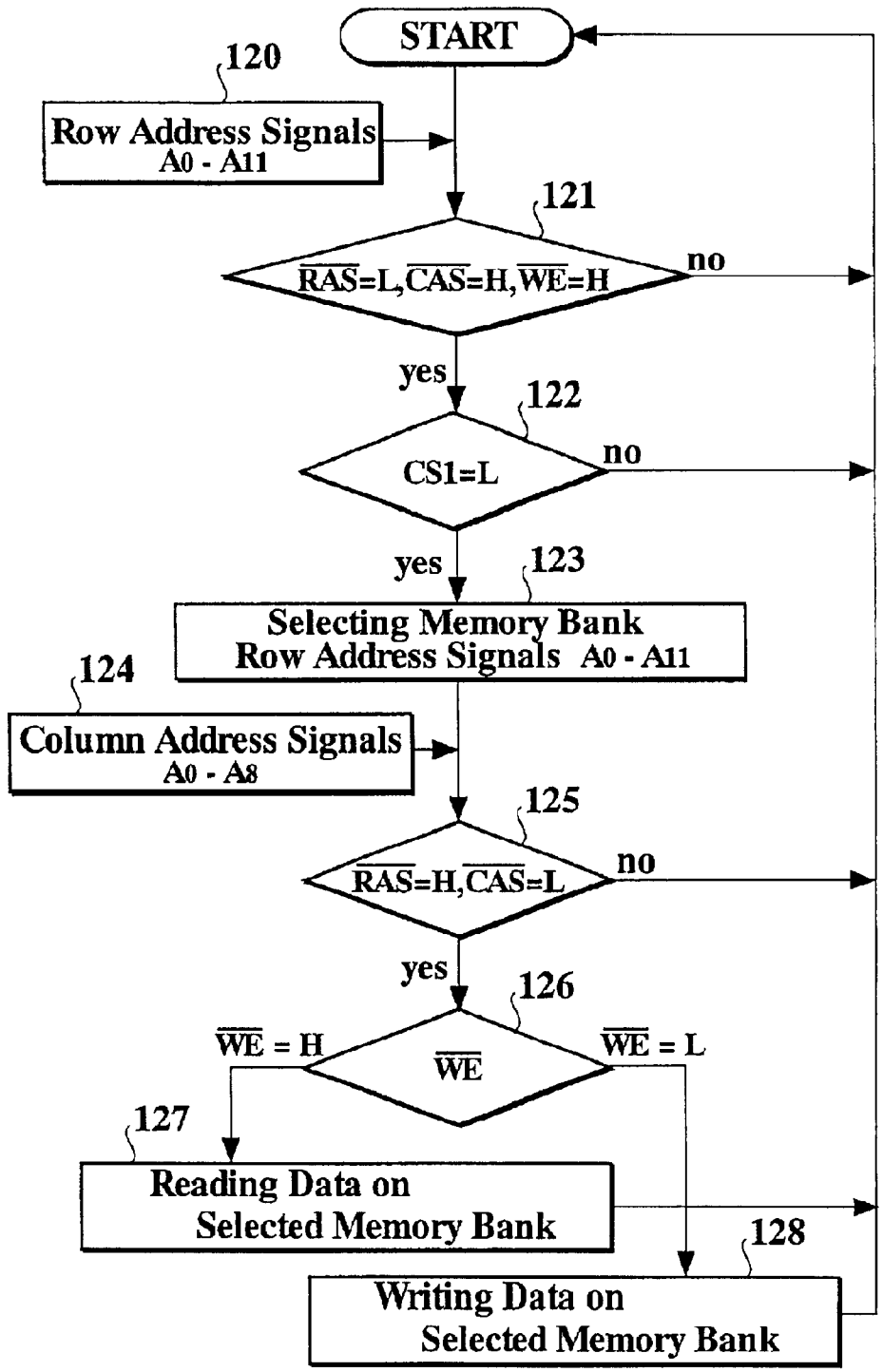
FIG. 17 is a flow chart showing the operation of the DRAM system of FIG. 16.
Figure 18:
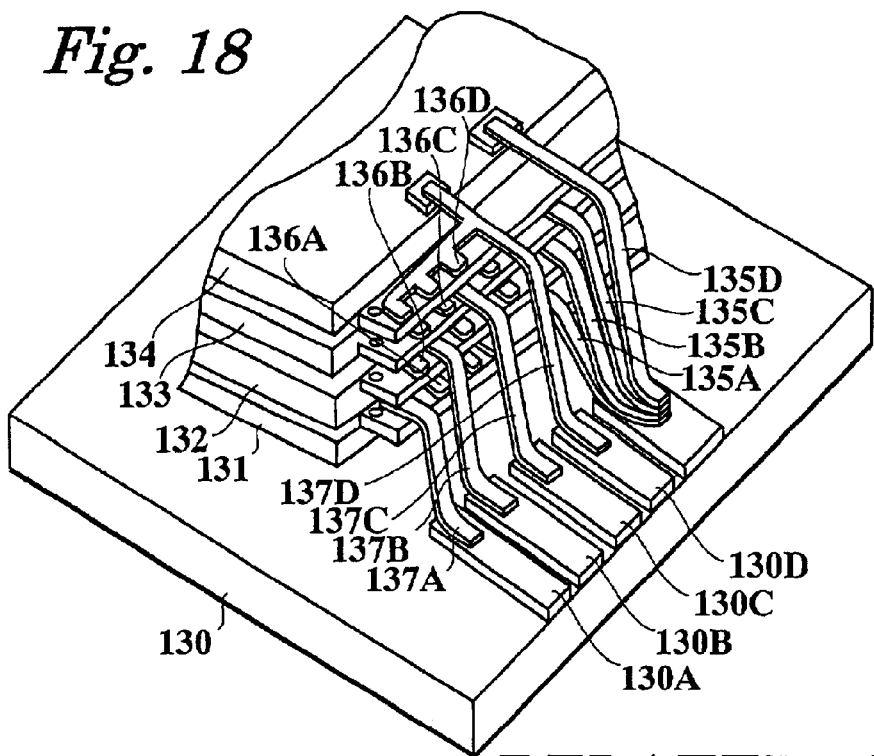
FIG. 18 is a perspective view of the essential parts of a semiconductor device of the related art.
Figure 19:
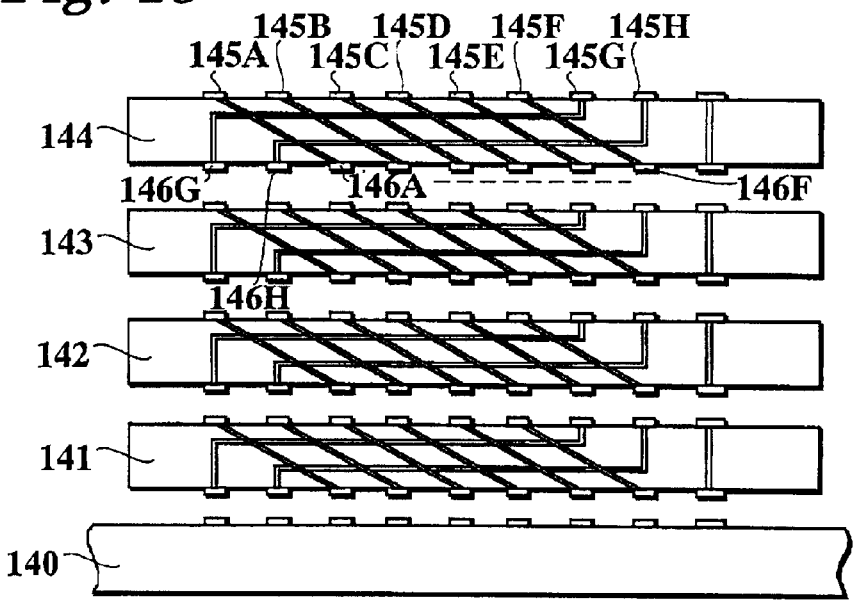
FIG. 19 is a cross section of a semiconductor device of the related art.

In a fifth embodiment of the invention, the semiconductor module 5 comprises four semiconductor devices 1 to 4, each of which includes a memory unit and an identifying unit that is separate from the memory unit. As shown in FIG. 15, the semiconductor module 5 are provided with: memory units 10A to 10D; selecting signal terminals for receiving the memory unit selecting signal CS1 which is common to the memory units 10A to 10D; a surplus signal terminal for receiving a row address signal $A_{12}$ as the memory unit selecting signal CS2; and identifying units 30A to 30D which are provided outside the memory units 10A to 10D, and identify the memory units 10A to 10D on the basis of the common memory unit selecting signal CS1 and the row address signal $A_{12}$.

The semiconductor device 1 with the memory unit 10A is electrically connected to another semiconductor device 1A that has an identifying unit 30A. The semiconductor device 1A provides the semiconductor device 1 with at least the memory unit selecting signals CS and bank selecting signals BS. The semiconductor devices 1 and 1A are constituted by at least separate semiconductor chips. Alternatively, they may be separately packaged, or may be integrally packaged on one substrate of a multiple package structure.

The semiconductor devices 2 to 4 including the memory units 10B to 10D are identical to the semiconductor device 1. Specifically, they are respectively and electrically connected to other semiconductor devices 2A to 4A, which include identifying units 30B to 30D.

The semiconductor module 5 of this embodiment write and read data as done by the semiconductor module 5 of the second embodiment, which will not be described here.

The semiconductor devices 1 to 4 and the semiconductor module 5 of this embodiment are not only as advantageous as the semiconductor devices 1 to 4 and the semiconductor module 5 of the first embodiment but also can improve system configuration tolerance since the identifying units 30A to 30D are provided outside the memory units. Further, the memory units 10A to 10D and the identifying units 30A to 30D can be separately manufactured.

Other Embodiments

The invention being thus described with reference to a number of embodiments, it will be obvious that the same may be varied in many ways. Such variations are not to be regarded as a departure from the spirit and scope of the invention, and all such modification as would be obvious to one skilled in the art are intended to be included with the scope of the invention.

For instance, the memory units 10A to 10D in the first to fifth embodiments may be replaced with rewritable memories or read-only memories. The rewritable memories may be at least volatile memories such as SRAMs or the like. The read-only memories may be at least non-volatile memories such as ROMs, EPROMs, EEPROMs.

Further, the memory units 10A to 10D may include peripheral units necessary for writing and reading information. In the foregoing description, each memory unit is assumed to be mounted on a semiconductor chip. Alternatively, the memory units may be mounted on a semiconductor chip together with logical units such as a central processing unit (CPU) and other units. Still further, the memory units may constitute one memory module mounted on one common substrate (i.e. a semiconductor wafer).

As described above, the invention provides the semiconductor device in which a plurality of identical memory units can be stacked. This is effective in reducing the selecting signal terminals for receiving memory unit selecting signals, increasing the storage capacity and downsizing the semiconductor device.

It is possible to adopt the package structure in which a plurality of memory units are stacked and a reduced number of selecting signal terminals are provided. Further, the package itself can be downsized.

The invention can further provide the semiconductor device in which stacked memory units can be easily identified.

Finally, the invention can provide the semiconductor module constituted by the foregoing semiconductor devices.

What is claimed is:
1. A semiconductor device comprising:
   a memory unit;
   a selecting signal terminal for receiving a memory unit selecting signal which is common to a plurality of memory units; and
   an identifying unit which includes a memory unit selecting circuit for selecting the memory unit on the basis of an identifier assigned to the memory unit and the memory unit selecting signal, and an identifier generating circuit, wherein the identifier generating circuit is an adder circuit for carrying the identifier of the memory unit by a half bit and generating identifiers for other memory units.

2. The semiconductor device of claim 1, wherein the identifier is one bit data or a plurality of bit data.

3. The semiconductor device of claim 1, wherein the identifier generating circuit is electrically connected to a standard voltage power supply for a circuit system or a circuit operation power supply, and the standard voltage power supply voltage or the circuit operation power supply is used as the identifier.

4. The semiconductor device of claim 1, wherein the memory unit selecting circuit is a comparator for comparing the identifier with the memory unit selecting signal.

5. The semiconductor device of claim 1, wherein the memory unit is either a DRAM or a SRAM.

6. The semiconductor device of claim 1, wherein the memory unit is a non-volatile memory which is ROM, EPROM, or EEPROM.

7. The semiconductor device of claim 1, wherein the selecting signal terminal which receives the memory unit selecting signal is a surplus signal terminal out of address signal terminals which are used for selecting address of the memory unit.

8. A semiconductor device comprising:

a memory unit;

a selecting signal terminal for receiving a memory unit selecting signal which is common to a plurality of memory units; and an identifying unit which is provided outside the memory unit and includes a memory unit selecting circuit for selecting the memory unit on the basis of an identifier assigned thereto and a memory unit selecting signal, and an identifier generating circuit, wherein the identifier generating circuit is an adder circuit for carrying the identifier of the memory unit by a half bit and generating identifiers for other memory units.

9. The semiconductor device of claim 8, wherein the memory unit and the identifying unit are constituted by separate semiconductor chips.

10. The semiconductor device of claim 9, wherein the semiconductor chips constituting the memory unit and the identifying unit are constituted by separate packages.

11. The semiconductor device of claim 9, wherein the semiconductor chips constituting the memory unit and the identifying unit are constituted by the same package.

12. The semiconductor device of claim 9, wherein the selecting signal terminal is provided in the semiconductor chip constituting the identifying unit.

13. A semiconductor module comprising:

a first memory unit;

a second memory unit positioned on or by the first memory unit;

a first selecting signal terminal provided in the first memory unit and for receiving a memory unit selecting signal which is common to a plurality of memory units;

a second selecting signal terminal provided in the second memory unit and for receiving the memory unit selecting signal which is common to a plurality of memory units;

a first identifying unit including: a first memory unit selecting circuit for selecting the first memory unit on the basis of a first identifier assigned thereto and the memory unit selection signal; and a first identifier generating circuit, wherein the first identifier generating circuit is a first adder circuit for carrying the first identifier of the first memory unit by a half bit and generating a second identifier for the second memory unit; and a second identifying unit including: a second memory unit selecting circuit for selecting the second memory unit on the basis of the second identifier assigned thereto and the memory unit selection signal; and a second identifier generating circuit, wherein the second identifier generating circuit is a second adder circuit for carrying the second identifier of the second memory unit by a half bit and generating a third identifier for a third memory unit.

14. The semiconductor module of claim 13, wherein the first identifier generating circuit is electrically connected to a standard voltage power supply for a circuit system or a circuit operation power supply, and the standard voltage power supply or the circuit operation power supply is used as the first identifier.

15. The semiconductor module of claim 13, wherein the first memory unit selecting circuit is a comparator for comparing the first identifier and the memory unit selecting signal, and the second memory unit selecting circuit is a comparator for comparing the second identifier and the memory unit selecting signal.

16. The semiconductor module of claim 13, wherein the second memory unit is stacked on the first memory unit.

17. The semiconductor module of claim 13, wherein the second memory unit is juxtaposed to the first memory unit.

18. The semiconductor module of claim 13 further comprising at least one memory unit and at least one identifying unit.

19. A semiconductor device comprising:

a memory unit;

a selecting signal terminal for receiving a memory unit selecting signal which is common to a plurality of memory units; and an identifying unit including an identifier generating circuit provided with a fuse element and a resistor element, wherein the resistor element has a resistance value which is higher than a resistance value of the fuse element for generating an identifier assigned to the memory unit, and a memory unit selecting circuit for selecting the memory unit on the basis of an identifier assigned thereto and the memory unit selecting signal.

20. The semiconductor device of claim 19, wherein: the fuse element has one end thereof electrically connected to a standard voltage power supply for a circuit system and the other end thereof electrically connected to the memory unit selecting circuit and one end of the resistance element; and the resistance element has the other end thereof electrically connected to the circuit operation power supply for the circuit system.

* * * * *